(12) United States Patent
Asnaashari

(10) Patent No.: US 10,749,529 B2
(45) Date of Patent: Aug. 18, 2020

(54) MEMORY DEVICE INCLUDING INTEGRATED DETERMINISTIC PATTERN RECOGNITION CIRCUITRY

(71) Applicant: Crossbar, Inc., Santa Clara, CA (US)

(72) Inventor: Mehdi Asnaashari, Danville, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 16/368,156

(22) Filed: Mar. 28, 2019

(65) Prior Publication Data

US 2019/0238136 A1 Aug. 1, 2019

Related U.S. Application Data

(63) Continuation-in-part of application No. 16/144,771, filed on Sep. 27, 2018.

(60) Provisional application No. 62/566,001, filed on Sep. 29, 2017.

(51) Int. Cl.
| | |
|---|---|
| *G11C 11/00* | (2006.01) |
| *H03K 19/1776* | (2020.01) |
| *G06F 1/10* | (2006.01) |
| *H03K 19/17736* | (2020.01) |
| *G11C 13/00* | (2006.01) |

(52) U.S. Cl.
CPC ......... *H03K 19/1776* (2013.01); *G06F 1/10* (2013.01); *H03K 19/1774* (2013.01); *G11C 13/0002* (2013.01)

(58) Field of Classification Search
CPC .. H03K 19/1776; H03K 19/1774; G06F 1/10; G11C 13/0069; G11C 13/0004
See application file for complete search history.

(56) References Cited

U.S. PATENT DOCUMENTS

| | | | |
|---|---|---|---|
| 2014/0071761 | A1 | 3/2014 | Sharon et al. |
| 2016/0224465 | A1* | 8/2016 | Morad ................. G06F 9/3877 |
| 2016/0359916 | A1 | 12/2016 | Kim et al. |
| 2017/0147233 | A1* | 5/2017 | De .......................... G06F 3/061 |
| 2018/0240510 | A1* | 8/2018 | Hush ..................... G11C 5/025 |
| 2019/0206460 | A1 | 7/2019 | O et al. |

OTHER PUBLICATIONS

Non-final Office Action for U.S. Appl. No. 16/428,173 dated May 28, 2020, 17 pages long.

* cited by examiner

*Primary Examiner* — Uyen Smet

(74) *Attorney, Agent, or Firm* — Wegman Hessler

(57) ABSTRACT

Various embodiments of the present disclosure provide for a memory device having inline processing circuitry. Disclosed memory devices can comprise logic circuits incorporating pattern recognition algorithms, in an embodiment. Comparative analysis functions on sets of data can be implemented with pulldown circuits connected to a common data line. In some embodiments, minimum values, maximum values and the like can be determined among the sets of data in a number of clock cycles comparable to a number of bits in the sets of data.

10 Claims, 20 Drawing Sheets

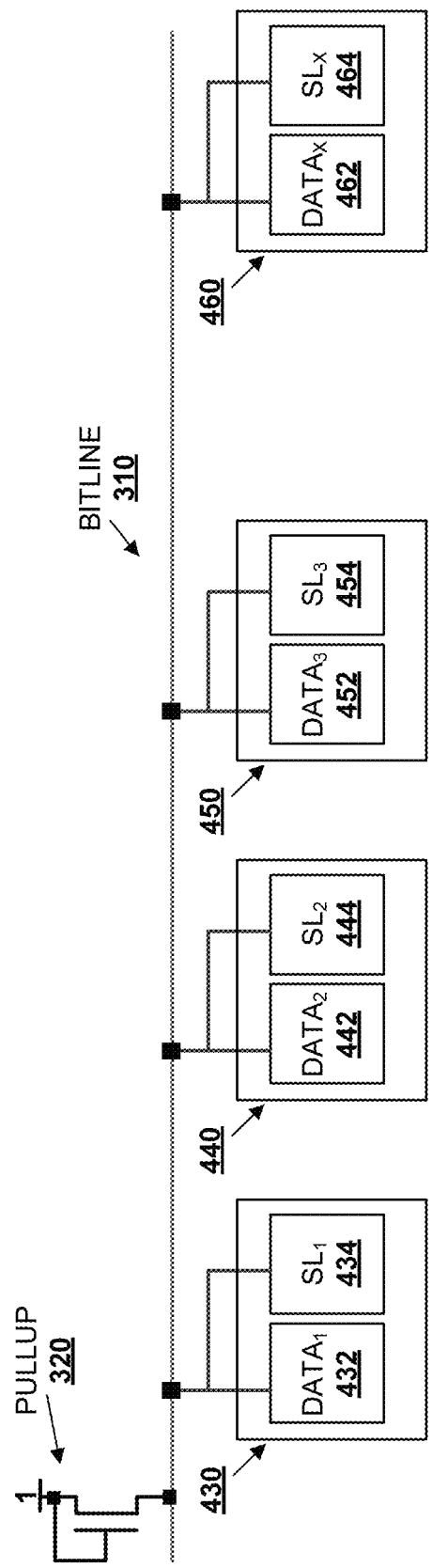

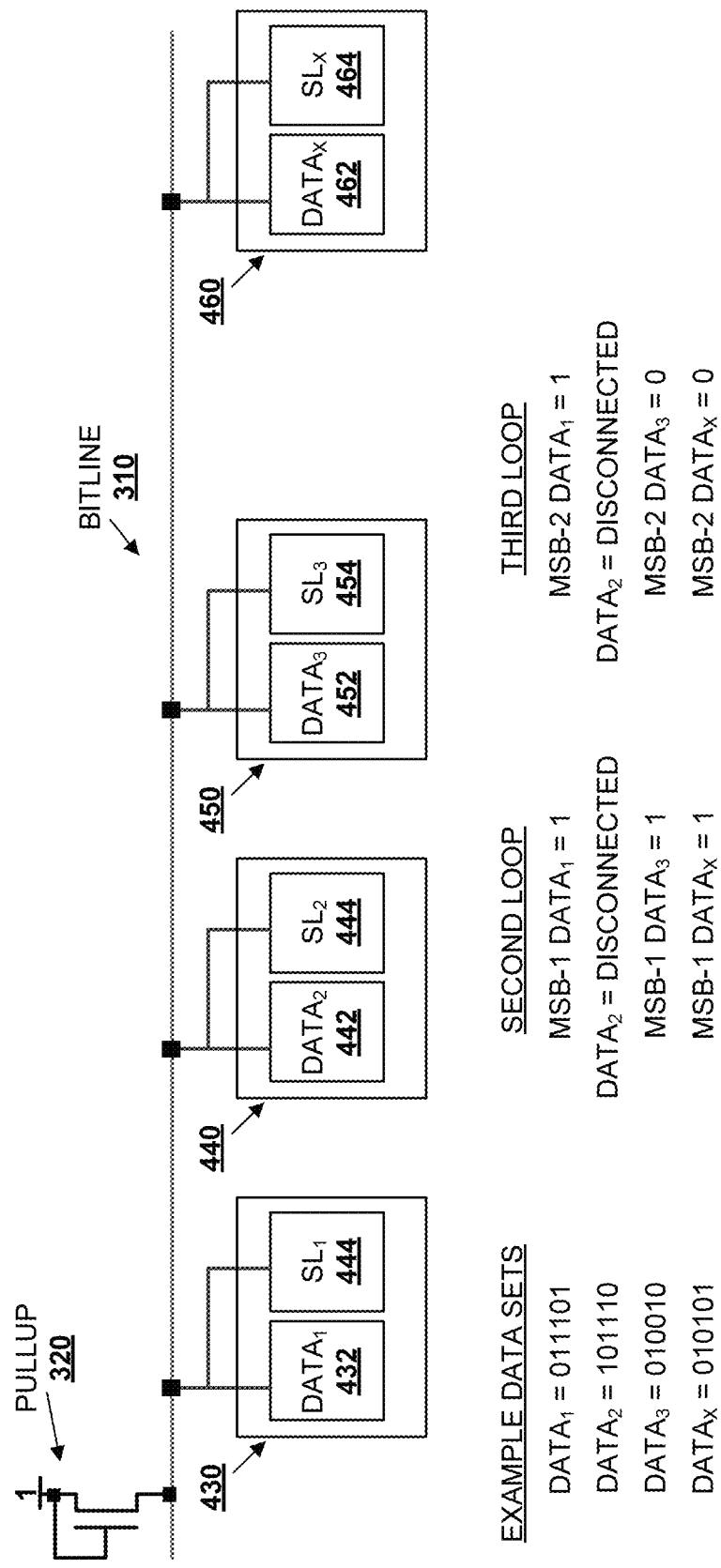

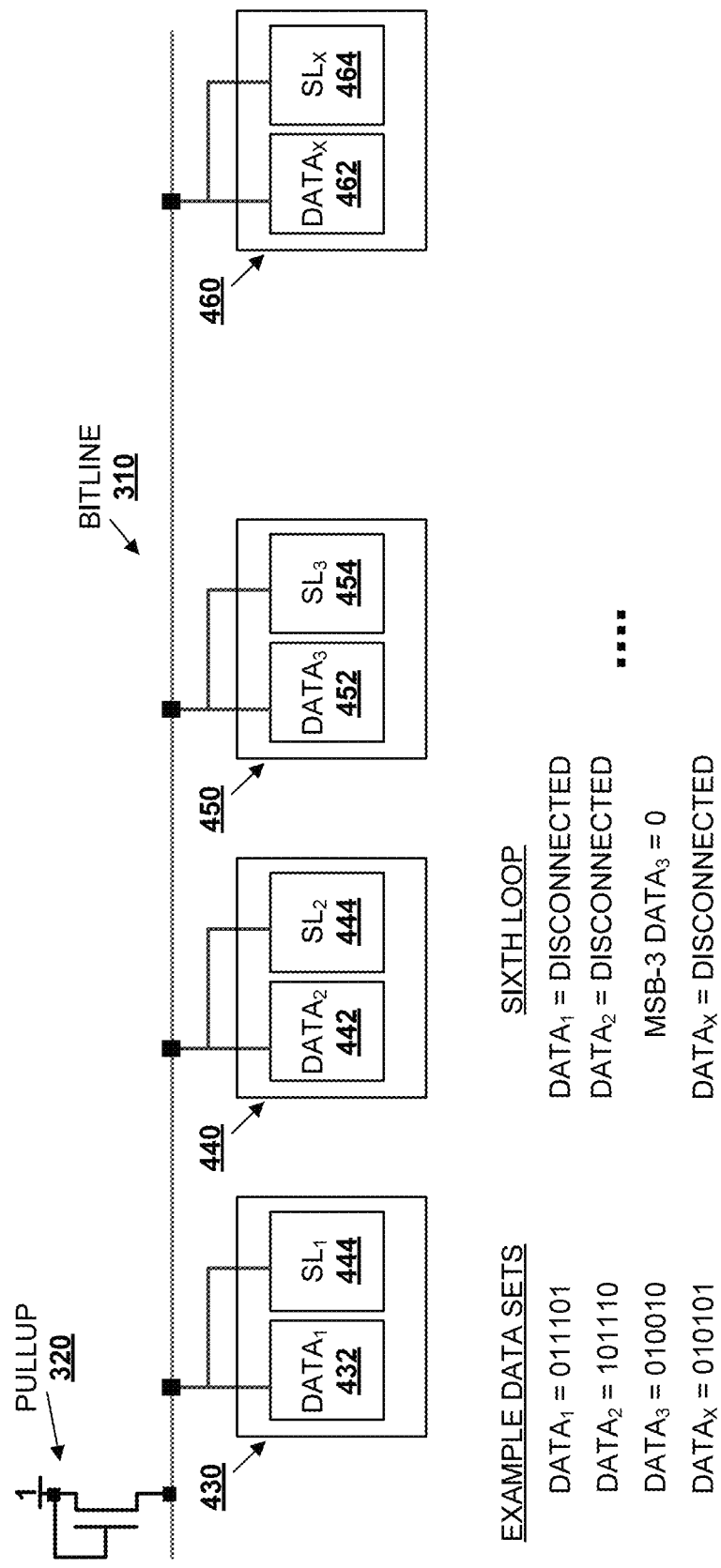

MEMORY DEVICE INCLUDING INTEGRATED DETERMINISTIC PATTERN RECOGNITION CIRCUITRY

CROSS-REFERENCE TO RELATED APPLICATIONS

This application is a continuation-in-part of U.S. patent application Ser. No. 16/144,771 filed Sep. 27, 2018, and entitled COMPUTING MEMORY ARCHITECTURE, which claims the benefit of U.S. Provisional Application Ser. No. 62/566,001, filed Sep. 29, 2017, and entitled "LOGIC, COMPUTING AND MANAGEMENT APPLICATIONS FOR RESISTIVE MEMORY DEVICES", the disclosures of which are hereby expressly incorporated by reference herein in their respective entireties and for all purposes.

TECHNICAL FIELD

This disclosure generally relates to an architecture for an electronic memory having inline deterministic pattern recognition processing capability.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

Over time, advancement in technology has provided an increase in a number of semiconductor devices, such as transistors, that can be fabricated on a given geometric area of a semiconductor chip. An implication of increasing the number of semiconductor devices is increasing memory capacity and processing power for the semiconductor chip and associated electronic devices.

Models for resistive-switching memory proposed by the inventor(s) utilize two-terminal structures. Two-terminal memory technology is contrasted, for instance, with gate-controlled transistors in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to having a third terminal that is adjacent to a set of conductive terminals. Rather than being operable through a stimulus applied to the third terminal, two-terminal memory devices can be controlled by applying a stimulus at one or both of the pair of conductive contacts. The inventor(s) of the present disclosure is further aware of a variety of two-terminal memory technologies, such as phase-change memory, magneto-resistive memory, conductive-bridging memory, as well as others.

While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others.

Drawing from existing research, the inventor(s) endeavors to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the present disclosure provide for a memory device having inline processing circuitry. Disclosed memory devices can comprise logic circuits incorporating pattern recognition algorithms, in an embodiment. Comparative analysis functions on sets of data can be implemented with pulldown circuits connected to a common data line. In some embodiments, minimum values, maximum values and the like can be determined among the sets of data in a number of clock cycles comparable to a number of bits in the sets of data.

In one or more embodiments, a memory device is provided. The memory device can comprise a non-volatile memory comprising an array of resistive switching memory devices formed overlying and monolithically integrated with a substrate of a semiconductor chip. Further, the memory device can comprise read sensors for reading data values stored at the array of resistive switching memory devices and a set of pattern recognition (PR) engines coupled to respective groups of the read sensors and coupled to a host interface configured to communicatively connect the memory device to a host device. In some embodiments, each of the set of PR engines is coupled to a common bitline of the memory device and a PR engine of the set of PR engines receives data read by a group of read sensors of the respective groups of read sensors from a portion of the array of resistive switching memory devices that is allocated to the PR engine. In further embodiments, the PR engine is configured to perform a comparative analysis function on the data and with respect to other sets of data written by other group of the read sensors to other PR engines of the set of PR engines. Still further, the PR engine can be configured to output a result of the comparative analysis function on the host interface to the host device.

In additional embodiments of the disclosure, provided is a method for matching sets of stored data with a set of input data. The method can comprise initializing a bitline of an electronic device with a pullup voltage and loading a set of data into a data portion of a pulldown circuit of a set of pulldown circuits connected to the bitline. Moreover, the method can comprise connecting a most significant bit of the set of data loaded to a measurement bit of the data portion to a sensor portion of the pulldown circuit and, in a first clock cycle, and in response to any pulldown circuit of the set of pulldown circuits pulling the bitline to a low voltage, disconnecting a subset of the pulldown circuits with data portions having a most significant bit value of 1. In additional embodiments, the method can comprise loading a subsequent bit of the set of data into the measurement bit connected to the sensor portion and, in a second clock cycle, and in response to any connected pulldown circuit pulling the bitline to the low voltage, disconnecting a second subset of the pulldown circuits with data portions having a subsequent bit value of 1. In still further embodiments, the method can comprise determining the set of data to be a minimum value set of data following a number of clock cycles equal at least to a number of bits of the set of data.

In another embodiment, the present disclosure provides a method for identifying a best match for data utilizing a logic circuit integrated within a memory chip. The method can comprise receiving an input data set from a host to match against stored data sets in non-volatile memory and retrieving instances of stored data set features from the non-volatile memory. In alternative or additional embodiments, the method can comprise utilizing a distance calculation algorithm to determine mathematical distance data representing determined mathematical distances between respective instances of stored data set features and the input data set and comparing the respective instances of the mathematical distances and identify a smallest mathematical distance. Further, the method can comprise outputting the smallest mathematical distance to the host as a closest match to the input data set.

The following description and the drawings set forth certain illustrative aspects of the specification. These aspects are indicative, however, of but a few of the various ways in which the principles of the specification can be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure can be practiced without these specific details, or with other methods, components, materials, etc. In other instances, well-known structures and devices are shown in block diagram form to facilitate describing the subject disclosure;

FIGS. 4, 4A, 4B and 4C illustrate an example comparative minimum determination of disparate sets of data that can be implemented for a memory device, in further embodiments;

DETAILED DESCRIPTION

Introduction

Figure 1:
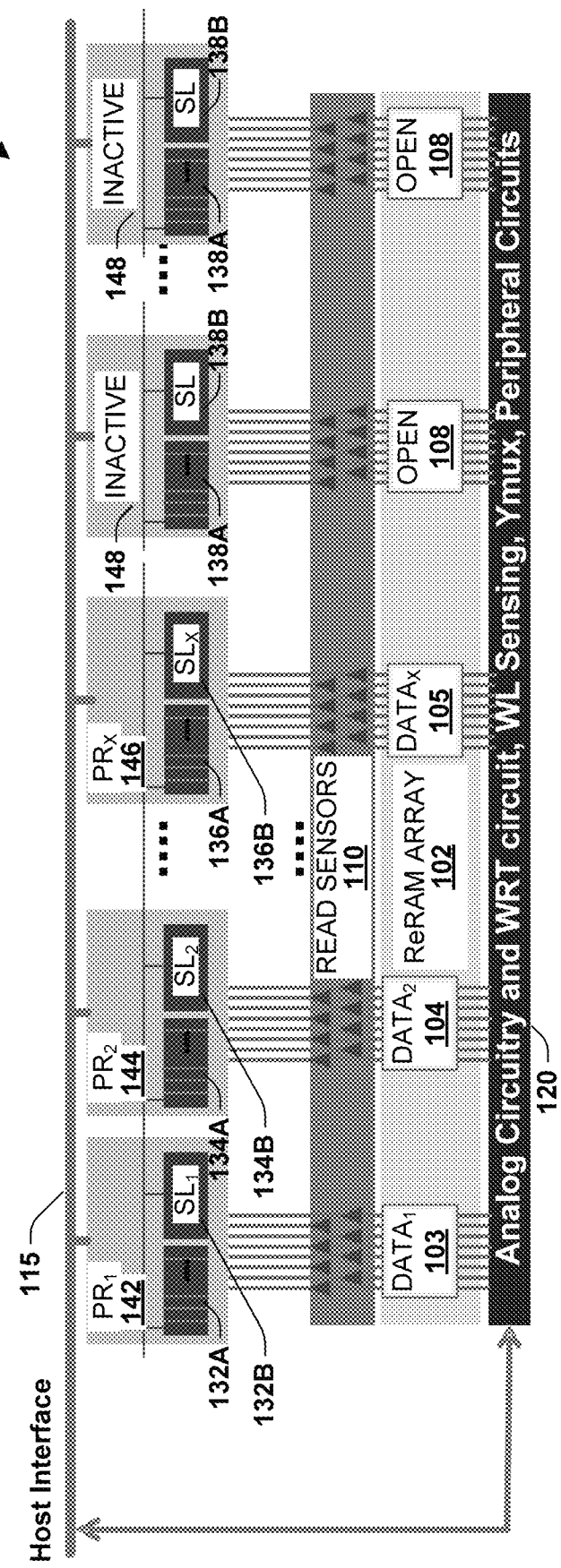
FIG. 1 depicts a block diagram of an example memory device comprising integrated pattern recognition processing circuitry according to disclosed embodiments.

As its name implies, a two-terminal memory device has two terminals or electrodes. Herein, the terms "electrode" and "terminal" are used interchangeably. Generally, a first electrode of two-terminal memory is referred to as a "top electrode" (TE) and a second electrode of the two-terminal memory is referred to as a "bottom electrode" (BE), although it is understood that electrodes of a two-terminal memory device can be according to any suitable arrangement, including a horizontal arrangement in which components of a memory cell are (substantially) side-by-side rather than overlying one another and including an oblique arrangement in which a memory cell stack is constructed at non-right angles to an underlying substrate. Situated between the TE and BE of a two-terminal memory device is typically an interface layer sometimes referred to as a switching layer, a resistive switching medium (RSM) or a resistive switching layer (RSL). When incorporating a RSM, the two-terminal memory device can be referred to as a (two-terminal) resistive switching device. In at least some disclosed embodiments, a non-volatile resistive switching device can be provided as a data storage device, and a volatile resistive switching device can be provided in series with the non-volatile resistive switching device to serve as an access device (also referred to as a selector device) for the data storage device. In such embodiments, the access device can mitigate current leakage in a 1 transistor—many resistive memory cell (1TnR) architecture, among other benefits.

By mapping digital information to non-volatile resistance states of a two-terminal memory cell, digital information can be stored at such device. An electronic device containing many of these two-terminal memory cells can likewise store significant quantities of data. High density arrays are configured to contain as many memory cells as possible for a given area of chip space, thereby maximizing data storage capacity of a memory chip, or system-on-chip device.

For two-terminal memory formed at intersections of metal lines within a wafer (e.g., a crossbar array), the inventor(s) of the subject disclosure is cognizant of two general conventions for arrangement of the memory cells. A first convention is the 1T1R memory array, in which each memory cell is isolated from electrical effects (e.g., current, including leak path current(s)) of surrounding circuitry by an associated transistor. A second convention is the 1TnR memory array (n being a positive number greater than one), where a group of multiple memory cells is isolated from electrical effects of surrounding circuitry by one (or more) transistors. In the 1T1R context, individual memory cells can be configured to have high current suppression between memory cells, significantly reducing leakage path currents for the 1T1R memory array. In the 1TnR context, individual memory cells can include a selector device (e.g., a volatile, two-terminal filamentary resistance device), to suppress leakage path currents among the group of multiple memory cells isolated by the one (or more) transistors.

Example Computing Memory Architecture

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure can be practiced without these specific details, or with other methods, components, materials, etc. In other instances, well-known structures and devices are shown in block diagram form to facilitate describing the subject disclosure.

Referring now to the drawings, FIG. 1 illustrates a block diagram of an example memory device 100 having integrated processing circuitry according to disclosed embodiments. Memory device 100 can comprise a two-terminal resistive switching memory array 102 (ReRAM array 102). ReRAM array 102 can comprise any suitable two-terminal resistive switching technology, such as resistive random access memory (RRAM), phase change resistive access memory (PCRAM), magnetic random access memory (MRAM), ferroelectric random access memory (FeRAM), organic random access memory (ORAM), conductive bridging random access memory (CB-RAM), or the like. The two-terminal resistive switching technology can be unipolar switching devices, bipolar switching devices, one-time programmable (OTP) devices, reversibly erasable devices, overwritable devices, or any suitable combination of the foregoing, in various disclosed embodiments.

In one or more embodiments, ReRAM array 102 can be formed monolithically integrated with a substrate 120 comprising complementary metal oxide semiconductor (CMOS) circuitry. In at least one embodiment, the CMOS circuitry can be formed within and on substrate 120 utilizing front-end-of-line semiconductor processing techniques, and ReRAM array 102 can be formed among one or more back-end-of-line layers of memory device 100, utilizing back-end-of-line semiconductor processing techniques. In alternative or additional embodiments, portions of the CMOS devices can be formed among the back-end-of-line layers, or portions of ReRAM array 102 can be formed utilizing front-end-of-line processing. Generally, ReRAM array 102 is monolithically integrated with and overlying substrate 120 on a single semiconductor chip. However, in aspects of the subject disclosure, multiple such chips can be functionally connected (e.g., cascaded) to interoperate as described herein on a single semiconductor package, multiple packages can be functionally connected to interoperate on a printed circuit board, or the like (e.g., see FIG. 7, infra) as would be evident to one of ordinary skill in the art, or reasonably conveyed to one of ordinary skill by way of the context provided herein.

Memory device 100 can further comprise read sensors 110 for reading data stored within ReRAM array 102. Read sensors 110 are formed integral to conductive lines (e.g., data lines, bit lines, word lines, source lines, etc.) on which portions of ReRAM array 102 are communicatively coupled. As illustrated by FIG. 1, portions of ReRAM array 102 are depicted including data block$_1$ 103, data block$_2$ 104, data block$_X$ 105 (where X is a suitable integer greater than 1), and one or more open (e.g., spare) data blocks 108. Collectively, the data blocks are referred to as data blocks 103-108.

Conductive lines connecting data blocks 103-108 with read sensors 110 are also extended to respective pattern recognition (PR) engines, including PR$_1$ 142, PR$_2$ 144, ... PR$_X$ 146, and inactive (e.g., spare) PRs 148 (referred to collectively as PR engines 142-148). In an embodiment, PR engines 142-148 can be formed to be directly coupled to respective subsets of the conductive lines (groups of lines with central arrows drawn from substrate 120, through ReRAM array 102 and read sensors 110, terminating at PR engines 142-148) that are connected to associated data blocks 103-108, as illustrated. In other embodiments, one or more multiplexers can be positioned between read sensors 110 and PR engines 142-148, or positioned between ReRAM array 102 and read sensors 110 (or a suitable combination of the foregoing), to facilitate selective connectivity (e.g., switchable connections) between the PR engines 142-148, read sensors 110 and data blocks 103-108.

Data read by read sensors 110 from respective data blocks 103-108 can be output to associated PR engines 142-148. Specifically, PR$_1$ 142 can receive data from data block$_1$ 103, PR$_2$ 144 can receive data from data block$_2$ 104, and so forth up to PR$_X$ 146 that can receive data from data block$_X$ 105. Similar data arrangements are available for open data blocks 108 and inactive PR engines 148.

Data received by a PR engine 142-148 can be processed and written to an associated data storage portion 132A, 134A, 136A, 138A (referred to collectively as data storage portions 132A-138A) of a PR engine. Respective sense logic portions 132B, 134B, 136B, 138B (referred to collectively as sense logic portions 132B-138B) can be configured to implement comparative analysis operations for data written to data storage portions 132A-138A, such as identifying a smallest value data set in one storage portion, relative to the other storage portions, identifying a maximum value data set in one storage portion relative the other storage portions, and the like. The comparative analysis operations can be in response to a host command and data transmitted on a host interface 115 from a host device and broadcasted to all PR engines (not depicted, but see FIG. 14, infra), in various embodiments.

In at least some embodiments, PR engines 142-148 can include data processing circuits to implement one or more processing algorithms on stored data. In further embodiments, the data processing algorithms can be performed on multiple sets of data (e.g., data stored in a data storage portion 103 and an input data set received on host interface 115) to produce output data, different from respective data sets of the multiple sets of data. In at least one embodiment, the data processing circuits can be configured to implement a mathematical distance calculation operation(s) (e.g., Manhattan distance, Euclidean distance, Sup-Norm (Mode 2) distance, or the like, or a suitable combination of the foregoing), or selectable operation of a set of processing algorithms, or the like. In further embodiments, the data processing circuits can include circuits for performing logic operations on data (e.g., input data received on host interface 115 and broadcasted to all PR engines and data written to data storage portions 103-108 corresponding to PR engines 142-148), mathematical operations on data, comparative analysis results on different sets of data, or any similar operation known in the art or reasonably conveyed to one of skill in the art by way of the context provided herein, or a suitable combination of the foregoing.

Figure 2:
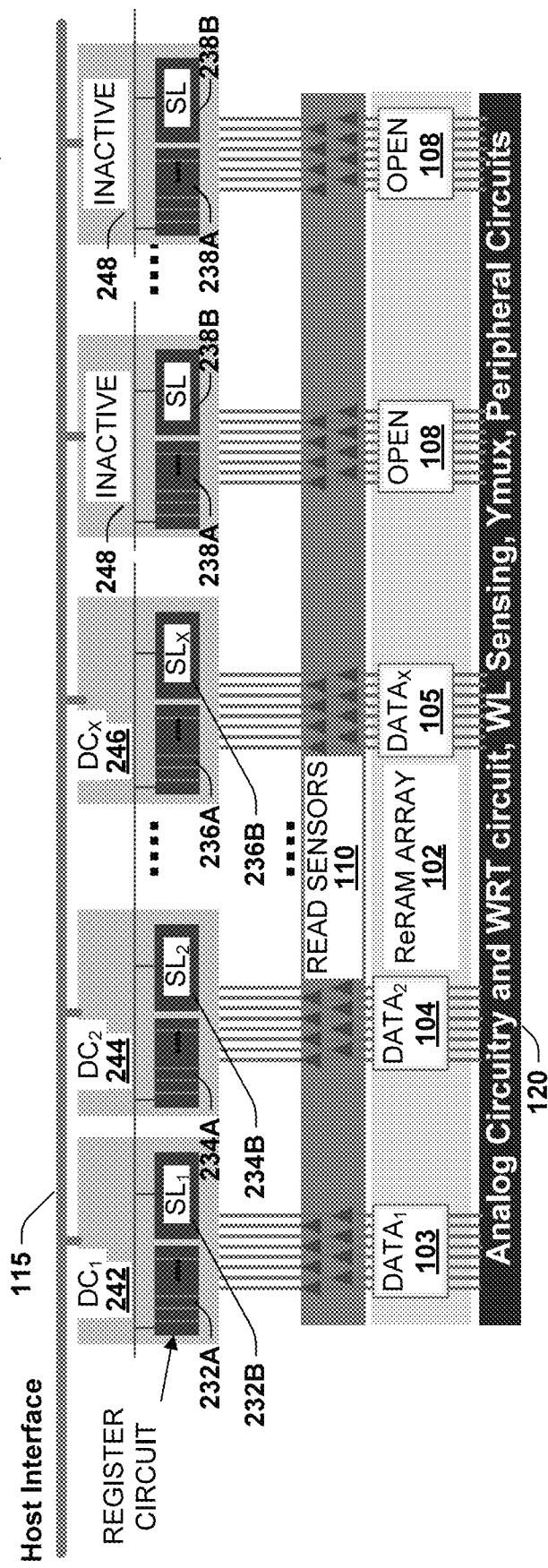
FIG. 2 illustrates a block diagram of a sample memory device with integrated distance calculation algorithms for comparing input data with stored data, in an embodiment(s)

Referring to FIG. 2, a memory device 200 according to alternative or additional embodiments of the present disclosure is illustrated. Memory device 200 can comprise a substrate 120 including CMOS circuitry, a ReRAM array 102 including data blocks 103-108, read sensors 110 and host interface 115, which can be substantially similar to that described above with respect to memory device 100 of FIG. 1, supra. In other embodiments, however, it should be appreciated that such elements can incorporate alternative or additional elements (e.g., components, sub-components), functionality, inter-operability, or the like.

Further, memory device 200 can comprise a set of distance calculation (DC) engines 242-248, including DC engine$_1$ 242, DC engine$_2$ 244, ... DC engine$_X$ 246, and one or more inactive (e.g., spare) DC engines 248. In an embodiment, each DC engine 242-248 can have a dedicated number of conductive lines (e.g., bit lines, word lines, data lines, source lines, etc.) extending from ReRAM array 102. The conductive lines associate a DC engine with one of data blocks 103-108. In other embodiments, a multiplexer(s) can be provided between read sensors 110 and DC engines 242-248 to provide inter-connectivity among different DC engines 242-248 and data blocks 103-108.

DC engines 242-248 can include data processing circuitry suitable to execute a mathematical distance algorithm on input data transmitted on host interface 115 and an associated set of stored data retrieved from data blocks 103-108. Each of DC engines 242-248 can generate a calculated mathematical distance data set from the input data from host broadcasted to all DC engines and respective stored data 103-108, and write the respective calculated mathematical distance data set to respective data portions 232A-238A of register and pulldown circuits (e.g., see FIG. 3, infra) of DC engines 242-248. Sense logic portions 232B-238B of DC engines 242-248 can perform comparative operations on the group of calculated mathematical distance data sets stored in the respective data portions 232A-238A, to determine a smallest distance data set to the input data, as one example, or largest distance data set to the input data, as another example. The smallest/largest distance data set can be output to a host device over host interface 115, as suitable.

In at least some embodiments, the smallest/largest distance data set can be compared with a threshold proximity data set. The threshold proximity data set can establish a threshold for the smallest distance data set to be deemed a match to the input data, or can establish a threshold for the largest distance data set to be deemed a mismatch to the input data, in various embodiments. Host data that does not match or resemble any of the stored data 103-105, hence all distances are above the threshold while looking for smallest distance, is considered a mismatch and can be stored as new data in one of open data block 108 to facilitate machine learning models, in which a later input data can be determined to match (or match within a threshold) or mismatch (or mismatch within a threshold) the new data.

Figure 7:
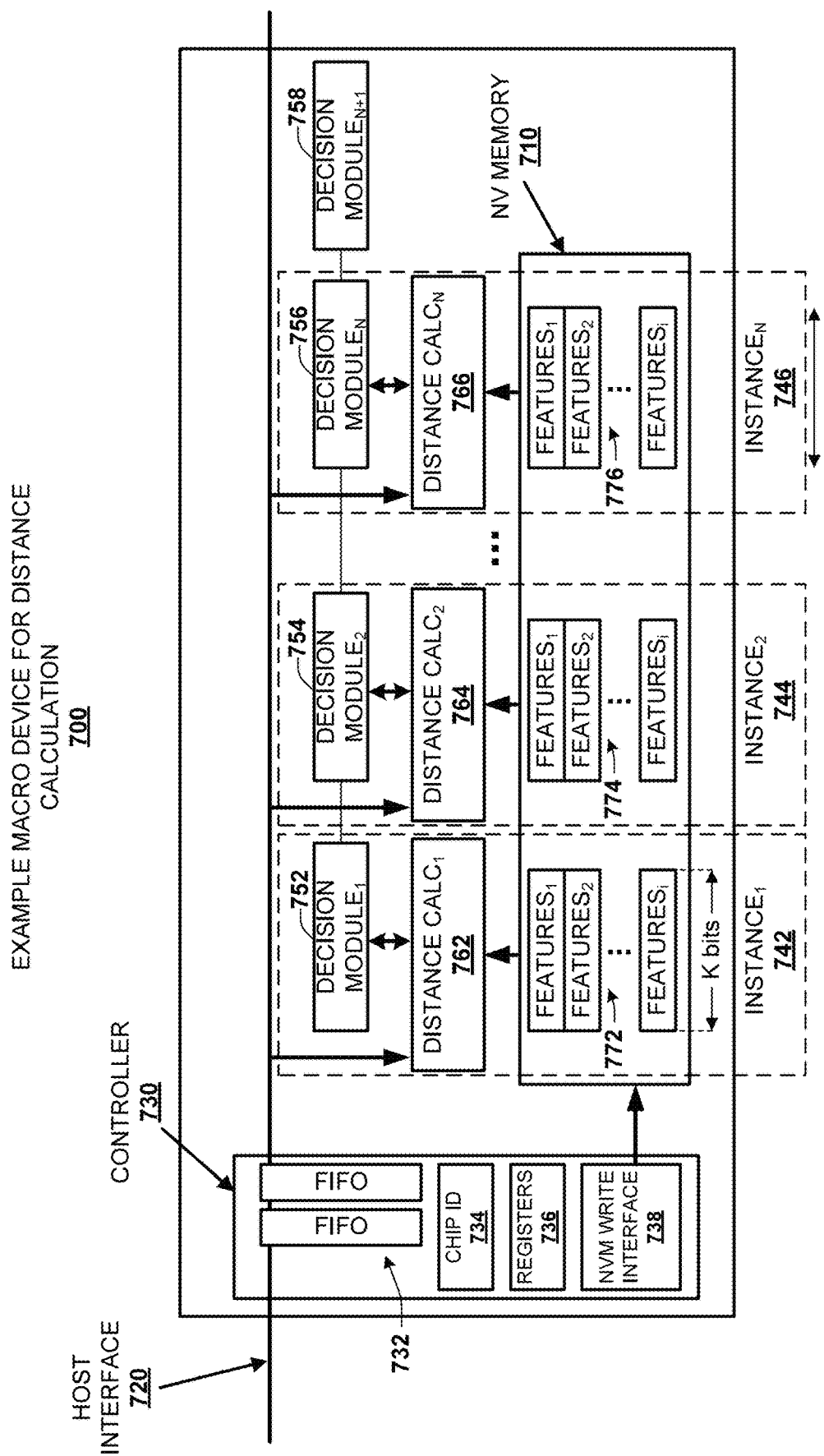
FIG. 7 illustrates an example macro device integrating non-volatile memory with processing circuitry according to still further embodiments.

In operation, and in response to a command from a host device on host interface 115, data is loaded by read sensors 110 from data blocks 103-108 into respective DC engines 242-248 (e.g., see also FIG. 7, infra). Input data from host interface 115 is broadcasted to each DC engines 242-248. The DC engines 242-248 then execute a data operation(s) utilizing operational circuitry stored within the DC engines 242-248 to calculate a distance between the input data and respective data sets loaded from data blocks 103-108 into DC engines 242-248. Resulting calculated data sets are written to data storage portions 232A-238A, and sense logic portions 232B-238B are activated according to predefined sequences (e.g., see FIGS. 4-4C, infra) to implement comparative analysis of the resulting calculated data sets (e.g., finding the closest distance data set or largest distance data set to the input data set).

In one embodiment, where comparative analysis determines a tie between matching calculated data sets (e.g., data sets of equal data values), each of the matching DC engines can report their data set to the host device as satisfying the criteria. In other embodiments, the calculated data sets can be made unique (e.g., by appending unique identifier bits to the calculated data sets such as its physical location within the array), such that the comparative analysis produces only a single output.

DC engines 242-248 can complete a comparative analysis result (for instance, closest match, least closest match, etc.) in a time equal to a sum of a calculation phase and a comparative determination phase. The calculation phase involves a time to compute a mathematical distance between input data and respective stored data from ReRAM array 102. This calculation phase time can be dependent on a number of features in the data set (or length of the feature vectors) involved in the distance calculation. The comparative determination phase can be dependent on a number of bits of the data storage portions 232A-238A involved for a particular distance algorithm and how many bits can be compared concurrently.

Memory device 200 can be programmed to deal with multiple comparative analysis results (e.g., multiple sets of calculated data being closest match or furthest match) in one or more manners. For instance, all matching data sets can be reported, in one embodiment. A single matching data set of the matching data sets can be reported in another embodiment. All data sets can be appended with unique identifier bits, and when the comparative analysis of calculated data bits is complete, a comparative analysis of the unique identifier bits can proceed to force a single matching data result, which can be reported in yet another embodiment.

In yet another embodiment, a matching data set reported to a host (by any of the foregoing mechanisms) can be disconnected from the comparative analysis. A second comparative analysis can be (re-)implemented for all of the calculated data sets minus the matching data set (already reported). A second matching data set (next to closest match, or next to furthest match), can be identified and reported to the host. The second matching data set can be disconnected (along with the matching data set) from a third comparative analysis, and the comparative analysis can be implemented the third time to identify a third best matching data set (or third closest match/furthest match), which can be reported to the host and disconnected from a fourth comparative analysis, and so on. This process of multiple comparative analysis operations, with previous matching data sets removed, can effectively serve to order the calculated data sets as a function of closest (furthest) match to the input data. Time to complete these multiple comparative analysis operations would be proportional to the number of such operations.

As introduced briefly above, DC engines 242-248 can include a threshold register (not depicted) that stores a threshold matching (or mismatching) value. A matching data set (having been determined the 'winner', so to speak, of a comparative analysis operation) determined to be a closest (or furthest) match can be compared by the DC engine 242-248 to the threshold matching value. If the matching data set satisfies a predetermined function compared to the threshold matching value (e.g., greater than, less than, equal or greater than, equal or less than, etc.), the matching data set can be qualified as passing the threshold in terms of matching (or mismatching) the input data. In some embodiments, passing the threshold can be a condition for reporting a matching data set to a host device in response to input data. Where no matching data set that passes the threshold is determined, the input data can be stored in one of the open data block 108, to facilitate machine learning that incorporates the input data as a new set of data for subsequent comparative analysis operations. In one or more embodiments, a DC engine 242-248 can be configured to classify itself as an inactive DC engine 248 in response to failing to produce a matching data set after a threshold number of comparative analysis operations, or from having a lowest matching data set count for a given number of comparative analysis operations, or the like. Once classified as inactive, an associated data block no longer contains relevant data and is classified as an open data block 108, such that when new data is identified (not matching any stored data within a threshold matching value), the new data is overwritten to the open data block 108, effectively evicting previous data written to the open data block 108.

In still further embodiments, ReRAM array 102 and data blocks 103-105 or 103-108 can be initialized with existing data sets (e.g., some previously learned data or feature vectors provided to memory device 200), or can begin empty, storing new input data only upon receipt of such data over host interface 115. Described differently, ReRAM array 102 can be programmed with existing data sets such as feature vectors, with new data or vectors added to open data blocks 108 for feature learning, or data stored in data blocks 103-108 can be trained from no existing data, and build a data set only from input data received on host interface 115. A state machine (not depicted, but see for example FIG. 13, infra) can be provided with memory device 200 that manages a bitmap, link list, or the like, to track inactive or spare DC engines 242-248 and choose a DC engine 242-248 in a round-robin fashion (normalizing use of spare DC engines 108 to mitigate or avoid overuse of a subset thereof), or other suitable management algorithm.

The data sets or vectors utilized herein can be operable in conjunction with any suitable data recognition, data matching, data approximation (e.g., closest match, farthest match, closest match passing a threshold, etc.) or data conditioning algorithms as understood in the art, or reasonably conveyed to one of ordinary skill in the art by way of the context provided herein. Examples can include data sets that define suitable categories of information, such as image feature data for image recognition processing, language feature data for word/grammar recognition processing, geographic feature data for map recognition processing, or compact representation of audio-visual data and so forth. In some embodiments, different data blocks 103-108 can be allocated by ReRAM array 102 to particular features of data; or in alternative or additional embodiments, sub-blocks within data blocks 103-108 can be allocated to different categories of data, as a function of address sub-blocks within data blocks 103-108, or other suitable mechanism.

In addition to data feature sets stored in data blocks 103-108, ReRAM array 102 can include initialization or configuration values for DC engines 242-248, which can be loaded to a corresponding DC engine 242-248 upon power up of memory device 200. Parallel loading of engine initialization values can substantially decrease power up time, particularly for embedded applications (e.g., on a portable device, handheld device, or other memory device 200 not connected to a continuous external power source). In one or more embodiments, respective DC engines 242-248 can be initialized with unique initialization data. Other dynamic parameters of memory device 200 can be stored in ReRAM array 102 and restored during power up of memory device 200.

Figure 3:
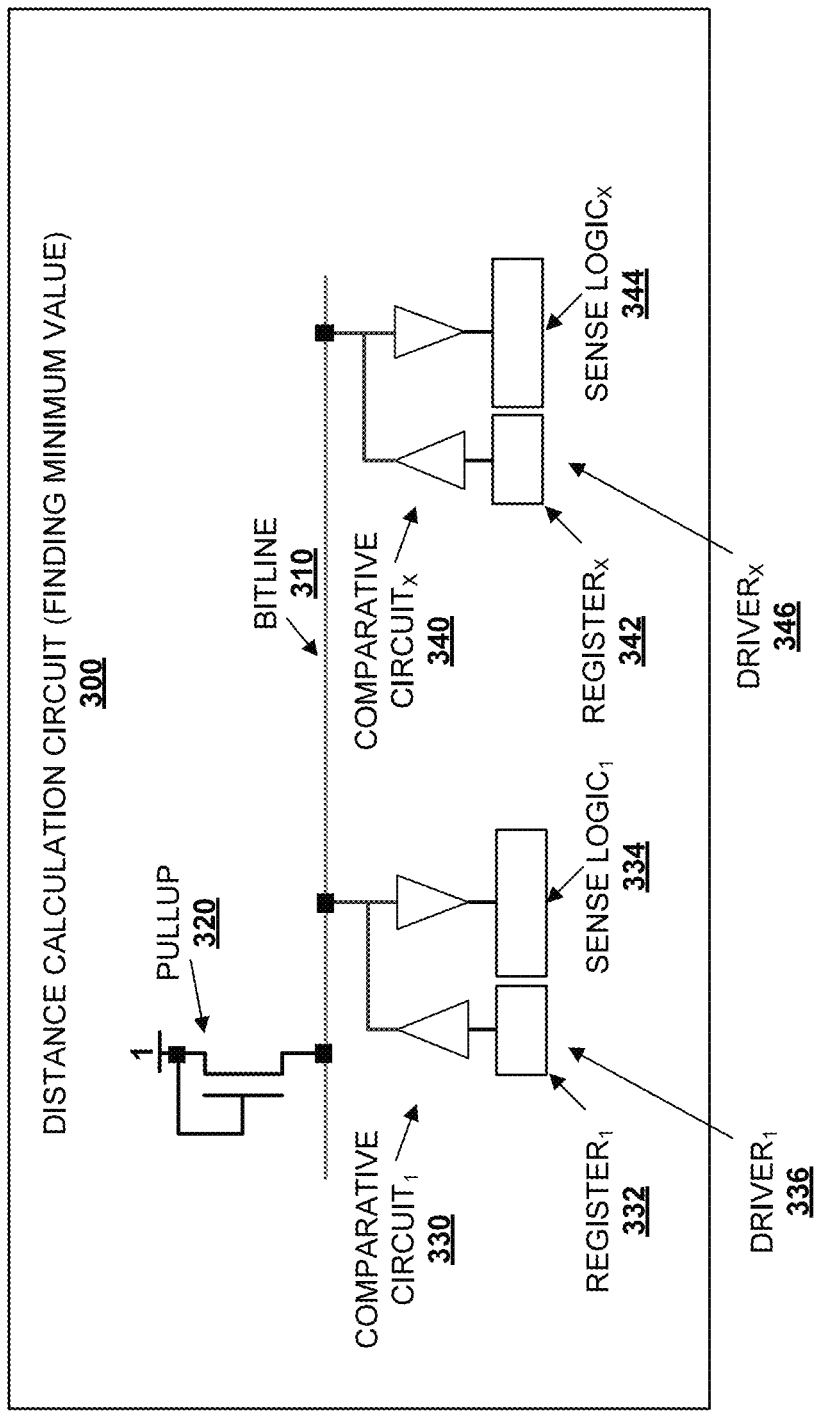
FIG. 3 illustrates a schematic diagram of an example circuit for comparative analysis of different sets of data that can be integrated with a disclosed memory device.

Referring now to FIG. 3, there is depicted a distance calculation circuit 300 according to embodiments of the present disclosure. Distance calculation circuit 300 can represent an example circuit for carrying out comparative analysis functions of DC engines 242-248 of FIG. 2, supra, or PR engines 142-148 of FIG. 1, in some embodiments. Distance calculation circuit 300 can comprise a bitline 310 having a pullup circuit 320 configured to apply a default voltage on bitline 310. The default voltage can be a high voltage in some embodiments (e.g., 1 volt or about 1 volt, 1.5 volts or about 1.5 volts, 2 volts or about 2 volts, a suitable range of any suitable voltage value within about 0.5 volts to about 3.0 volts, or any other suitable voltage), or can be a low voltage (e.g., below about 0.5 volts, about zero volts, etc.) in other embodiments.

Comparative circuits including comparative circuit$_1$ 330 . . . comparative circuit$_X$ 340 (where X is any suitable integer greater than one), collectively referred to as comparative circuits 330-340, are selectively connected to bitline 310 (e.g., by way of respective electrical switches). Respective comparative circuits 330-340 include a shift register circuit 332, 342, open drain driver 336, 346, and a sense logic circuit 334, 344. Shift register circuits 332, 342 include a register having a number of bits for writing a set of data (the set of data including up to the number of bits), the number of bits including a measurement bit. In some embodiment, each of the register circuits 332, 342 includes distances calculated by their respective DC engines 242-248. At any given time, one of the bits of register circuit can be designated a measurement bit. In one embodiment, the measurement bit can be the most significant bit (MSB) of the shift register. In another embodiment, the measurement bit can be the least significant bit (LSB) of the shift register.

Sense logic 334, 344 are connected to bitline 310 and their respective measurement bit of the set of bits stored by their respective shift register circuit 332, 342. In some embodiments, in response to the measurement bit of the set of bits of any of shift register circuits 332, 342 being a 0, the associated open drained drivers 336, 346 pull bitline 310 to a low voltage. Open drained drivers 336, 346, bitline 310, and pullup 320 collectively create a wired AND network with inputs to the open drained drivers 336, 346 being their respective measurement bit. When all of the measurement bits are a '1', bitline 310 will remain at at a '1'. When any one or more of the measurement bits are at a '0', their corresponding open drained drivers will pull the bitline 310 to a '0'. In one embodiment, the wired AND network can be replaced by combination of gates, or a suitable combination of gates in conjunction with a wired AND network to achieve the same function. In contrast, where all measurement bits of shift register circuits 332, 334 are a '1', bitline 310 is not pulled down and remains at the default voltage.

In an alternative embodiment (e.g., where the default voltage on bitline 310 is low), comparative circuits 330-340 can comprise pullup circuits configured to pull the voltage on bitline 310 high in response to a value of a measurement bit of the pullup circuit matching a predetermined data value mapped to activating the pullup circuit (e.g., a 0 value or 1 value of the measurement bit, suitable to match design choice of the pullup circuit).

Sense logic 334, 344 is configured to compare the voltage on bitline 310 to its respective measurement bit value of shift register circuits 332, 342. In response to determining a condition is satisfied relative to the voltage of bitline 310 and the measurement bit value of an associated circuit 332, 342, sense logic 334, 344 is configured to selectively disconnect an associated one of comparative circuits 330-340 from bitline 310, effectively removing the disconnected comparative circuit 330-340 from that comparative analysis operation. Comparative circuit$_1$ 330 is referenced for the following illustrative example for operational rules for a minimum value comparative analysis operation, though this is applicable to any of comparative circuits 330-340. Moreover, it should be understood that operational rules for a maximum value comparative analysis operation (or inversion of bit values applied to the operational rules for the minimum value comparative analysis operation) can be implemented within the scope of the present disclosure as well.

For the minimum value operation rule example, where the voltage of bitline 310 is pulled low and the measurement bit value of shift register circuit 332 sensed by sense logic 334 is high, sense logic 334 detects this scenario as having a higher distance than remaining comparative circuits and disconnects comparative circuit$_1$ 330 from bitline 310, effectively removing its comparative circuit from an instance of a minimum value comparative analysis operation. Where the voltage of bitline 310 is pulled low and the measurement bit value of register and pulldown circuit$_1$ 332 sensed by sense logic$_1$ 334 is low, sense logic 334 does not disconnect comparative circuit$_1$ 330 from bitline 310, and the comparative circuit remains part of that instance of the comparative analysis operation. Where the voltage of bitline 310 is not pulled low (is at the default voltage), sense logic 334 does not disconnect comparative circuit$_1$ 330 from bitline 310 for any measurement bit value. These rules are applied by comparative circuits 330-340 for each bit value of the set of bits stored in shift register circuits 332, 342 to identify which of the set of bits is the smallest bit value. In one embodiment, the measurement bit of each comparative circuit 330, 340 corresponds to the MSB of the shift register circuits 332, 342. On every iteration of the comparative analysis, the shift register circuits 332, 342 shift their respective data to the left by one position and hence measuring bit of each comparative circuit 330, 340 is now the next bit of the distance. Number of iteration is based on the set of bits stored in shift register circuits 332, 342, which also corresponds to the distances calculated by DC engines. At each iteration, instances of the comparative circuits detecting a larger distance than remaining instances (if any) will remove themselves from participating in remaining iterations. At end the comparative analysis operation, one or more instances having the same lowest distance will remain.

FIGS. 4, 4A, 4B and 4C illustrate an example minimum determination for sets of data within a memory device of the present disclosure. The memory device comprises a bitline 310 and pullup circuit 320 providing a default high voltage on bitline 310. Comparative circuits 430, 440, 450, . . . 460 (referred to collectively as comparative circuits 430-460) are provided and connected to bitline 310. As described with respect to FIG. 3, supra, the comparative circuits 430-460 are configured to pull bitline 310 low in response to a measurement bit of '0' or low for any of comparative circuits 430-360.

As illustrated, each comparative circuit 430-460 comprises a data set, including data$_1$ 432, data$_2$ 442, data$_3$ 452, . . . data$_X$ 462 (collectively: data sets 432-462) stored in a register of the associated comparative circuits 430-460 and coupled with a driver circuit for pulling bitline 310 low as described herein. Further, each comparative circuit comprises a sense logic circuit, including: sense logic$_1$ 434, sense logic$_2$ 444, sense logic$_3$ 454, . . . sense logic$_X$, 464 (collectively: sense logic circuits 434-464). Example data sets for data sets 432-462 are illustrated. Upon initiation of minimum determination 400, most significant bit values of data sets 432-462 are located in respective measurement bits of data sets 432-462, and connected to the sense logic circuits 434-464, respectively. In a first iteration (or loop), three measurement bit values are '0', and so three associated open drain drivers pull bitline 310 low (though any one is effective to pull bitline 310 low). Based on the above operational rules for the minimum value comparative analysis, sense logic circuits 434-464 disconnect an associated comparative circuit 430-460 having a '1' data value when bitline 310 is pulled low. In this case, data$_2$ 442 has the measurement bit (in this case the most significant bit) value of 1, and thus sense logic$_2$ 444 disconnects comparative circuit 440 from bitline 410.

Referring now to FIG. 4A, bits of remaining (not disconnected) comparative circuits 430, 450, 460 are shifted one bit into the respective measurement bits of register circuits, thereby connecting the next most significant bit (or MSB-1) with the sense logic circuits 444, 454, 464. These MSB-1 values of data$_1$ 432, data$_3$ 452 and data$_X$ 462 are all '1' (data$_2$ 442 is disconnected from bitline 310, so does not affect the bitline), and therefore no driver pulls bitline 310 low. Accordingly, sense logic circuits 444, 454, 464 do not disconnect any of comparative circuits 430, 450, 460 for this second iteration.

In a third iteration, next most significant bit values (MSB-2) are shifted into the measurement bits of each of the register circuits. This results in two measurement bits having '0' value, and thus open drain drivers of these comparative circuits pull the voltage of bitline 310 low. In response, sense logic$_1$ 444 detects that the measurement bit of data$_1$ 432 is high when the voltage of bitline 310 is low, and selectively disconnects comparative circuit$_1$ 430 from the bitline 310, effectively removing comparative circuit$_1$ from the minimum determination 400.

Figure 4B:
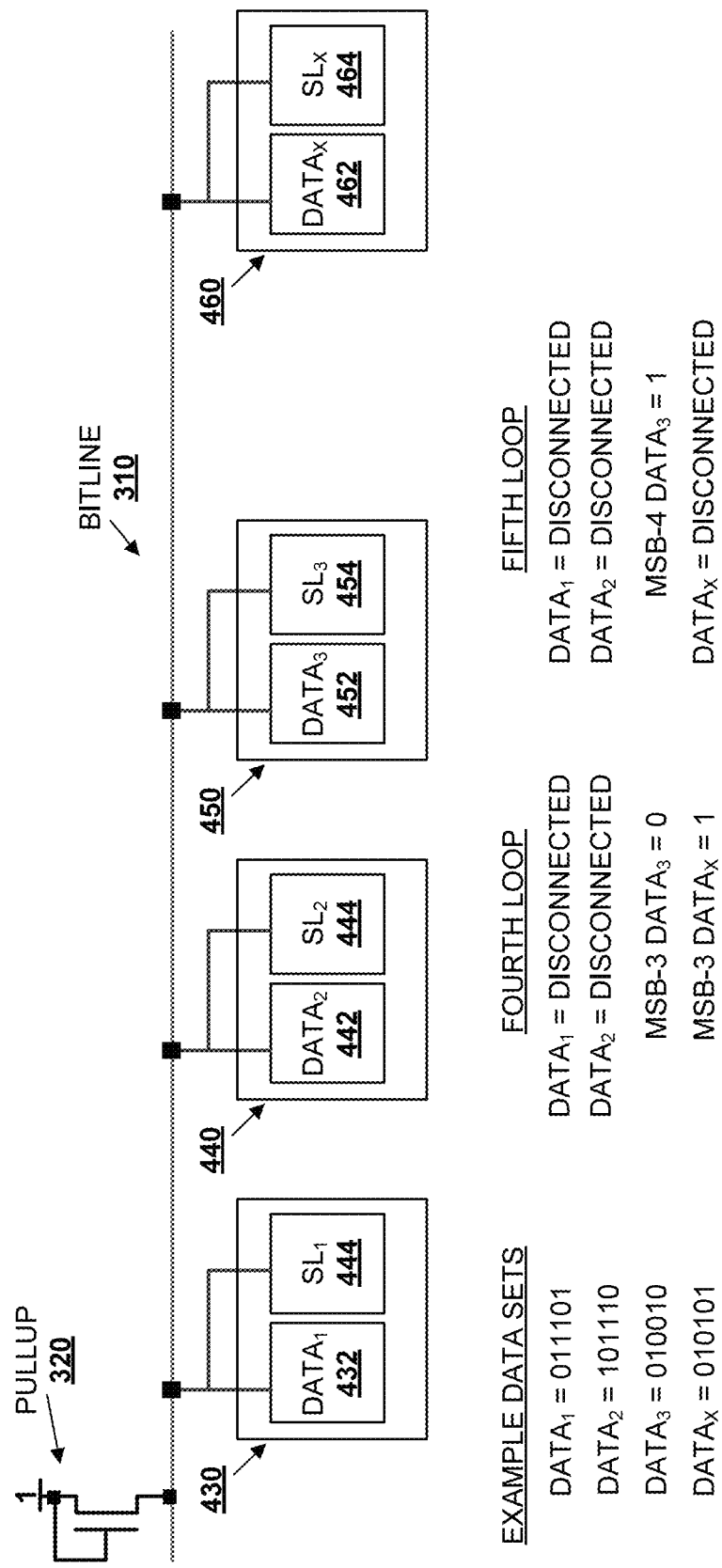

Referring to FIG. 4B, example minimum determination 400 continues. In a fourth iteration, both data$_1$ 432 and data$_2$ 442 have been disconnected from the minimum value comparative analysis operation. Bits of remaining data sets 452, 462 are shifted such that respective MSB-3 bits are loaded into the measurement bits of register circuits. Accordingly, the MSB-3 value of data$_3$ 452 is '0' and the driver of comparative circuit 450 pulls the voltage of bitline 310 low. As a result, sense logic$_X$ 464 detects that the measurement bit of data$_X$ 462 is high when the voltage of bitline 310 is low, and disconnects comparative circuit 460 from bitline 310. In an embodiment, a state machine (not depicted, but see FIG. 13, infra) can track a number of remaining comparative circuits 430-460 and terminate minimum determination 400 when only a single comparative circuit 450 is connected to bitline 310. The data set$_3$ 452 can then be identified as the smallest value data set. In other embodiments, additional iterations can continue until all data bits of data set$_3$ 452 are analyzed, which then establishes data set$_3$ 452 is the smallest value data set. These additional iterations are illustrated at FIG. 4C. Because comparative circuit 450 is the only comparative circuit remaining, bitline 310 will remain high when a measurement bit of data set$_3$ 452 is high, and will be pulled low only when the measurement bit of data set$_3$ 452 is low. Accordingly, there will be no circumstance when sense logic$_3$ 454 will disconnect comparative circuit 450 from bitline 310 according to the operational rules defined above. Thus, comparative circuit 450 remains to the end of minimum determination 400, and is reported as the lowest value data set.

Figure 5:
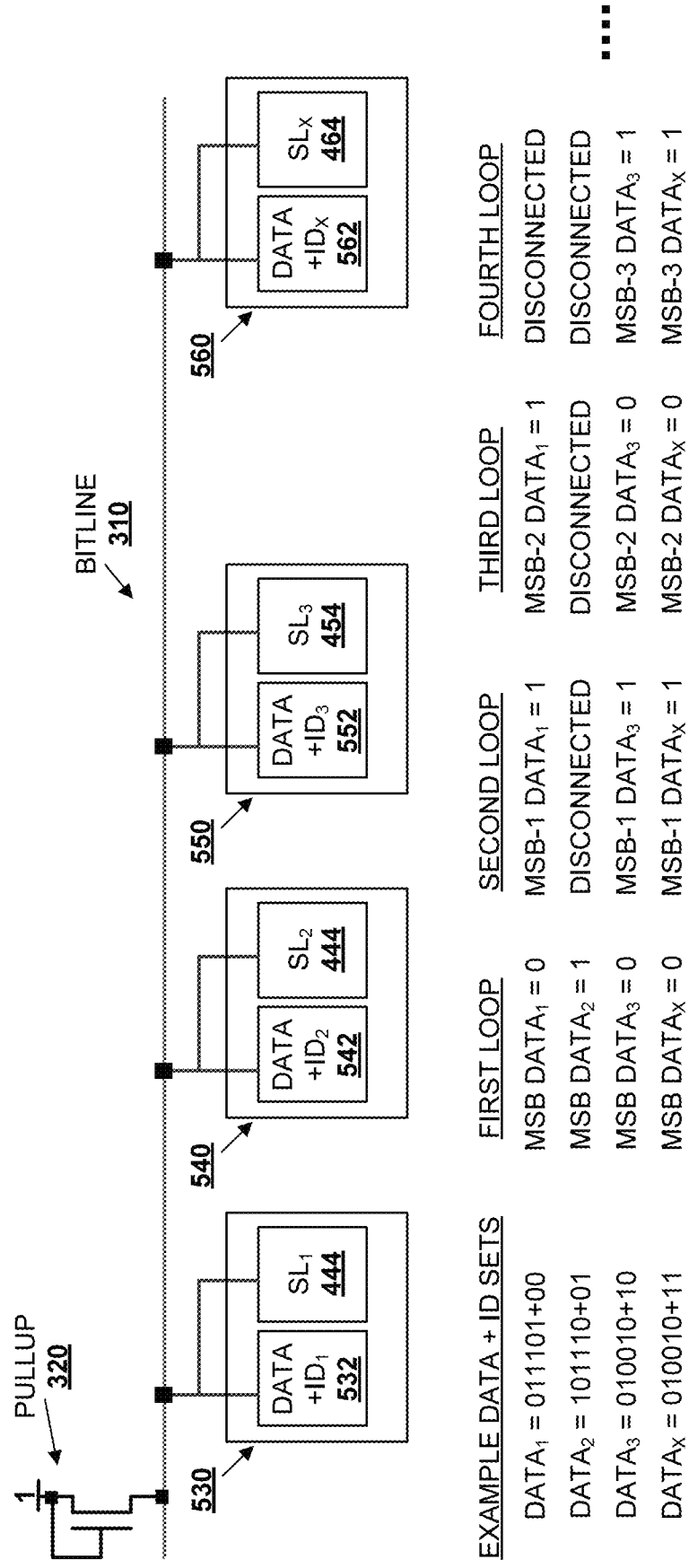
FIGS. 5 and 5A depict example comparative minimum determination of disparate sets of data according to alternative embodiments of the present disclosure.
Figure 5A:
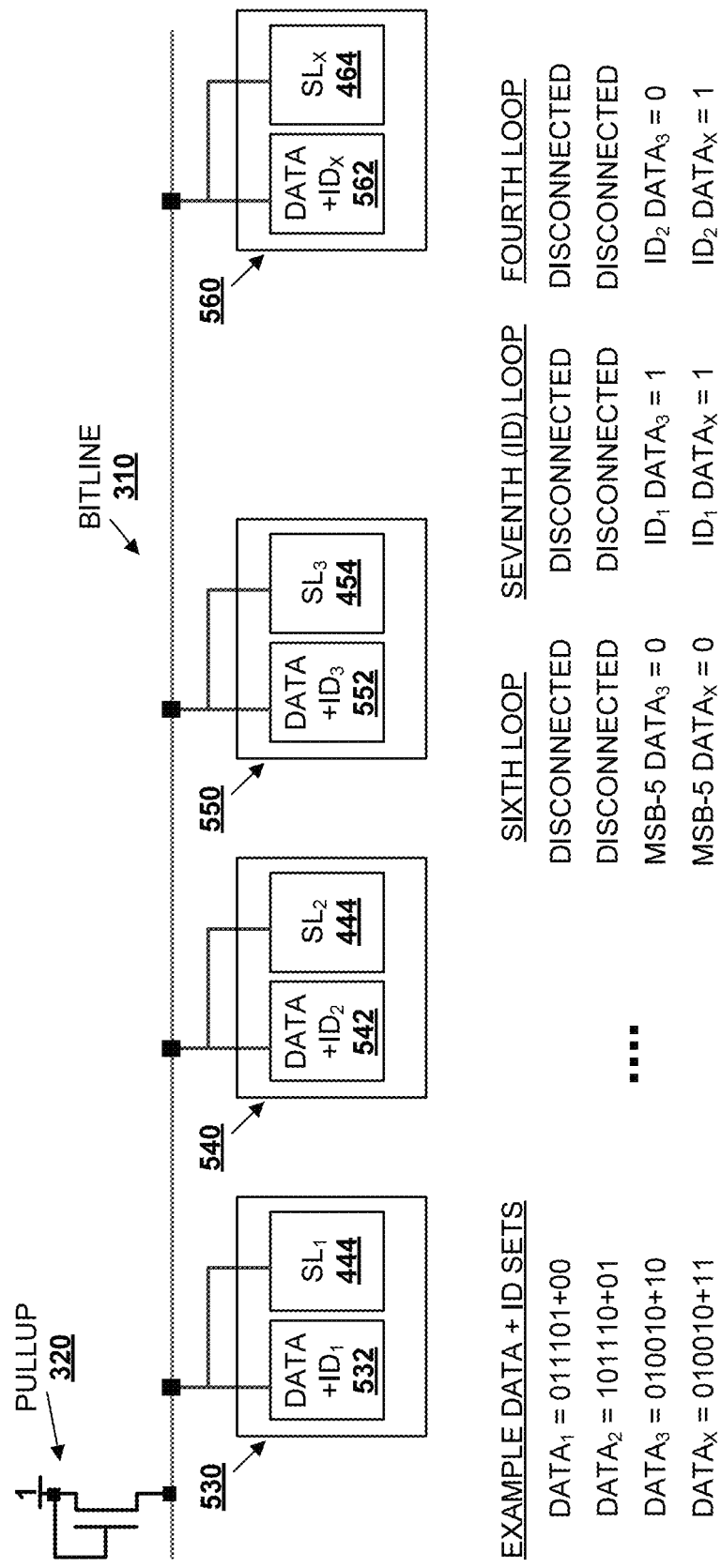

FIGS. 5 and 5A illustrate an example minimum determination 500 according to alternative embodiments of the subject disclosure, which includes identifier bits to uniquely identify each data set under analysis. The identifier bits can be bits uniquely identifying comparative circuits 530-560, in an embodiment. The identifier bits can be appended to stored data loaded from a memory array into comparative circuits 530-650 (e.g., data blocks 103-108 of memory device 100, or memory device 200). This is illustrated by FIG. 5. For instance, data set$_1$ 532=the data set: 011101 and includes unique identifier bits 00 appended thereto. Likewise, data set$_2$ 542=the data set: 101110 and includes unique identifier bits 01 appended thereto, and so on. Data set$_3$ 552 and data set$_X$ 562 are the same data set: 010010, but are appended with respective unique identifier bits: 10 and 11, respectively. As a result, the identifier bits can distinguish otherwise identical data bits loaded from storage. This ensures a single result of minimum determination 500. The iterations depicted by FIGS. 5 and 5A establish that data sets 532 and 542 will be disconnected, leaving data sets 552 and 562. On the seventh and eight loops of minimum determination 500, when the identifier bits are loaded into the measurement bit of comparative circuits 550 and 560, a single data set remains.

In some embodiments, a single data set can be determined in response to a disclosed comparative analysis operation, and output as a resulting data set. In other embodiments, all data sets determined to satisfy a comparative analysis operation (e.g., minimum value, maximum value, etc.) can be output in response to a comparative analysis operation.

Figure 6:
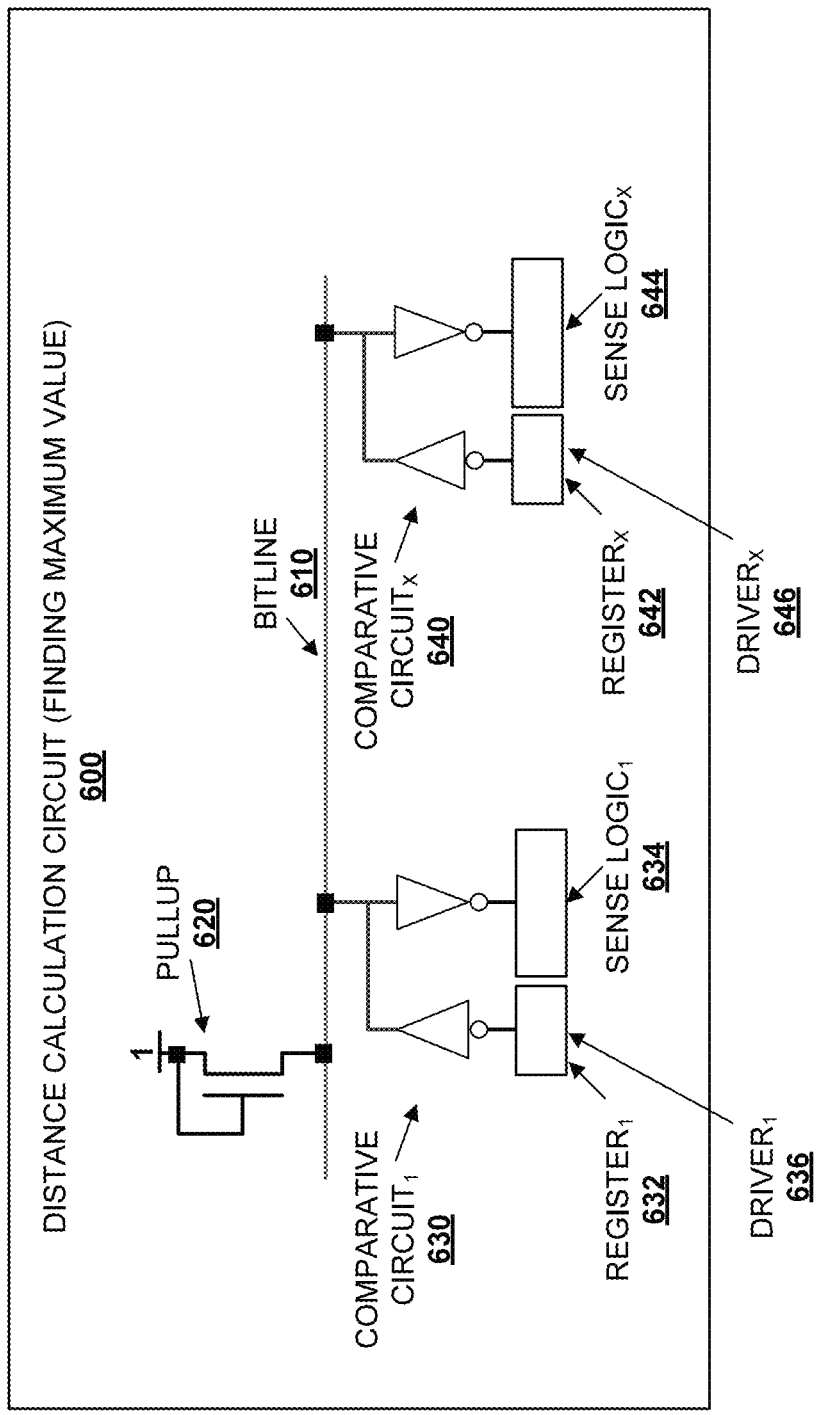
FIG. 6 depicts a schematic diagram of an example circuit for comparative analysis of disparate sets of data according to still further embodiments.

FIG. 6 illustrates an example distance calculation circuit 600 configured to identify a maximum value data set of a set of data sets. Distance calculation circuit 600 can comprise a bitline 610 initialized with a high voltage by a pullup circuit 620. A set of comparative circuits 630, 640 load disparate data sets from non-volatile memory into an associated register portion 632, 642. Measurement bit values of 0 are inverted to 1, and will not cause drivers 636, 646 to pull down bitline 610 to a low voltage. In contrast, measurement bit values of 1 are inverted to 0, and do cause drivers 636, 646 to pull down the voltage of bitline 610 to low voltage. Likewise, inputs received by sense logic 634, 644 are inverted. This includes respective inverted measurement bit values (which are inverted again upon reaching sense logic 634, 644) and the bitline value (which is inverted a single time upon reaching sense logic 634, 644). In at least some embodiments, a modified rule (determining maximum value) for disconnecting comparative circuits 630-640 can be implemented: if the (inverted) bitline voltage is high and (double-inverted) data value is low, that comparative circuit is disconnected from bitline 610. If the (inverted) bitline voltage is high and (double-inverted) data value is high, that comparative circuit is not disconnected. If the (inverted) bitline is low, no comparative circuit is disconnected. Once all bits are shifted to the measurement bit and the rules implemented, the remaining data set(s) is the maximum. Those of skill in the art can recognize other rules for determining maximum values within the scope of the present disclosure, as suitable and depending on implementation. As provided in FIGS. 5 and 5A, identifier bits can also be used to guarantee a single result of the maximum determination for calculation circuit 600.

In various embodiments of the present disclosure, distance calculator engines can be implemented as a macro, with multiple such macros cascaded on a semiconductor die, multiple semiconductor dies (having multiple distance calculator macros) can be cascaded in a package, and multiple such packages cascaded on a printed circuit board. In such embodiments, the set of macros, dies and packages can share the same host data bus, have the distance bits shared, and independent process engines calculating respective distance values to a common input data set. Once distances are calculated, each calculated distance can participate in a maximum value/minimum value comparative analysis operation. A flexible/scalable architecture to maximize a number of distance calculators while maintaining parallel calculation and comparative analysis operations are provided, enabling massive parallel search of an input data set among large numbers of ReRAM arrays, in various embodiments.

One example macro is illustrated by distance calculation macro 700 of FIG. 7. Macro 700 includes a memory controller 730 in operational connection with NV memory array 710. A host interface 720 provides commands and data to memory controller 730, which includes buffers (e.g., first input first output (FIFO) buffers 732), a chip ID 734, registers 736 and non-volatile memory interface 738 for writing data to NV memory array 710.

Within macro 700, sets of decision modules (752, 754, 756), distance calculation modules (762, 764, 766) and feature sets (772, 774, 776) stored in NV memory array 710 define a feature matching instance. Depicted are N feature matching instances, including instance$_1$ 742, instance$_2$ 744, . . . instance$_N$ 746 (referred to collectively as feature matching instances 742-746), where N is a suitable integer greater than 1. Feature sets 772, 774, 776 can be a number, K, contiguous bits in memory, where K can be any suitable integer value. In an embodiment, K can be a number of bits equal to a bus width of host interface 720, such that a number of bits received on host interface 720 in a given clock cycle can match a number of bits transferred from NV memory array 710 to distance calculation modules 762, 764, 766 in the clock cycle. In other embodiments, K can be multiples of the number of bits of the bus width of host interface 720, and host interface 720 can be clocked at a frequency that is multiples higher than a clock operating NV memory array 710 and distance calculation modules 762, 764, 766. For instance, where K is 8× larger than the bus width of host interface 720, host interface 720 can be clocked 8× faster than the transfer rate of data from NV memory array 710 to distance calculator modules 762, 764, 766. Other combinations of data sizes (K, bus width), clock rates, or even number of clock cycles for loading data into distance calculation modules 762, 764, 766 are within the scope of the present disclosure.

In operation, input data for matching among feature sets 772, 774, 776 of macro 700 are provided by a host device on host interface 720. The input data is copied into each of distance calculator modules 762, 764, 766, and a feature set from respective instances 772, 774, 776 is loaded from NV memory array 710 into distance calculator modules 762, 764, 766 as well. Distance calculator modules 762, 764, 766 can be programmed to execute a mathematical distance algorithm on sets of data loaded therein (e.g., from host interface 720 and from a feature set(s) of NV memory array 710), producing calculated distance data sets. Various suitable mathematical distance algorithms can be programmed to distance calculator modules 762, 764, 766. Examples include, but are not limited to: a Manhattan distance defined by the following equation:

$$M1 = Sum|Vi-Pi|$$

where V is the input data set, and P is one of feature sets 772, 774, 776. As another example, a Sup-Norm (or Max-Norm) can be utilized according to the following equation:

$$M2 = Max|Vi-Pi|$$

and as yet another example, a Euclidean distance can be utilized according to the following equation:

$$M3 = Sqr(sum(Vi-Pi)^2).$$

It should be appreciated that the feature sets of different instances 742, 744, 746 can contain different feature set data, and thus are the features1, features2, . . . , features$_N$ can be different feature sets among the different instances 742, 744, 746.

Each distance calculator module 762, 764, 766 generates calculated distance data between the input data set and respective feature data 772, 774, 776 of the different instances 742, 744, 746. The calculated distance data is then loaded into respective decision modules 752, 754, 756 to for comparative analysis operation, as described with respect to FIGS. 3-5 (for minimum determination), or FIG. 6 (for maximum determination). A result of the comparative analysis operation produces a minimum(maximum) data set, which can be reported to the host device over host interface 720 in response to the input data, in an embodiment.

In another embodiment, a minimum(maximum) data set from this comparative analysis operation can be loaded into decision module$_{N+1}$ 758. Subsequently, additional feature data 772, 774, 776 can be loaded into distance calculator modules 762, 764, 766, which determine additional calculated distance data sets from the additional feature data 772, 774, 776. These additional calculated distance data sets are loaded into decision modules 752, 754, 756 and compared against the minimum(maximum) data set stored in decision module$_{N+1}$ 758 to determine if one of the additional calculated distance data sets produce a smaller (or larger) value. If so, the smaller (or larger) value is overwritten to decision module$_{N+1}$ 758, and so forth until all data feature sets 772, 774, 776 are completed by macro 700.

In still further embodiments, macro 700 can comprise a threshold data value (e.g., stored in registers 736, or other suitable location). Upon completion of all decision module comparative analysis operations, a value stored in decision module$_{N+1}$ can be compared to the threshold data value. If satisfying a condition compared to the threshold data value, the value stored in decision module$_{N+1}$ can be output as a match to the input data over host interface 720. Where the condition is not satisfied, a threshold match failure can be output over the host interface 720 in response to the input data. Optionally, the stored value can still be output to the host device on a threshold match failure. The input data can be stored in open data blocks of NV memory array 710 to facilitate machine learning, in an embodiment. The open data block can be incorporated into a new instance of instances 742, 744, 746 to include the input data in comparative analysis operations of subsequent input data received by macro 700.

The diagrams included herein are described with respect to interaction between several logic circuit, memory arrays, memory devices or memory architectures. It should be appreciated that such diagrams can include those circuits, arrays, devices and architectures specified therein, some of the specified logic circuits or memory arrays/devices/architectures, or suitable alternative or additional logic circuits, memory arrays/devices/architectures. Sub-components can also be implemented as electrically connected to other sub-components rather than included within a parent architecture. Likewise, individual components can be implemented in a combined architecture according to other embodiments. For instance, distance calculator modules 762, 764, 766 can be implemented as sub-components of decision modules 752, 754, 756, in an embodiment. Moreover, logic circuits, memory arrays/devices/architectures illustrated in one Figure can be combined with suitable logic circuits, memory arrays/devices/architecture illustrated in one or more other Figures, as would be understood by one of skill in the art. For instance, computer 1402 of FIG. 14, infra, can be implemented in conjunction with one or more disclosed memory devices, or state machine 1320, clock source(s) 1310, and other components of FIG. 13, infra, can be implemented in conjunction with one or more disclosed memory devices. The subject disclosure is not intended to be limited to the explicit embodiments depicted; rather, the disclosure expressly incorporates all variations and modifications understood by one of ordinary skill or reasonably conveyed to one of ordinary skill by way of the context provided herein.

In view of the exemplary diagrams described herein, process methods that can be implemented in accordance with the disclosed subject matter will be better appreciated with reference to the flow charts of FIGS. 8-12B. While for purposes of simplicity of explanation, the methods of FIGS. 8-12B are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein, and in some embodiments additional method steps not depicted but known to one skill in the art or made known by way of the context provided herein, can be incorporated into the described methods. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 8:
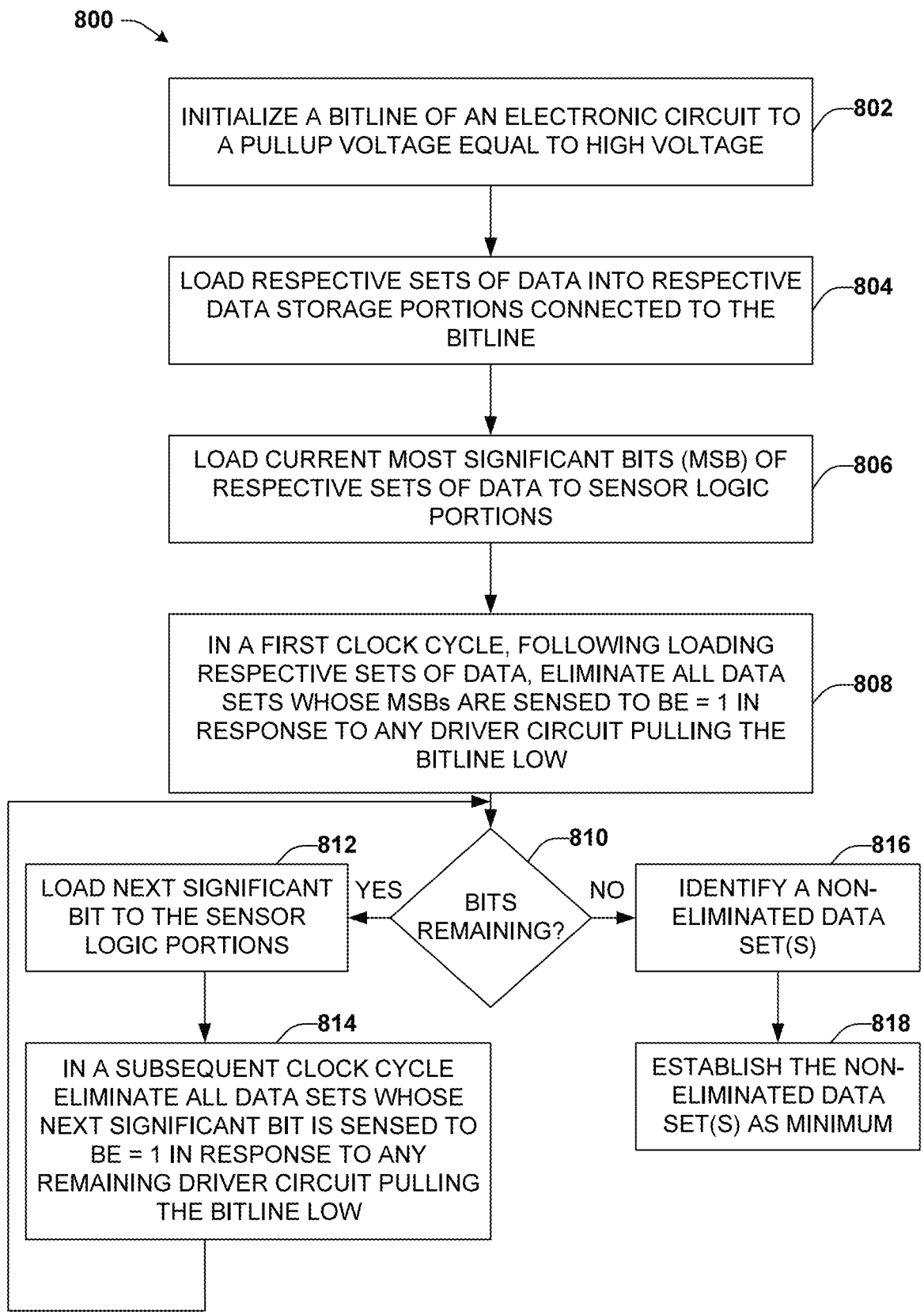
FIG. 8 illustrates a flowchart of a sample method for identifying minimum values of disparate sets of data utilizing pulldown circuits integral with a memory device.

Referring now to FIG. 8, there is depicted a flowchart of a sample method for performing a comparative analysis of multiple sets of data according to one or more embodiments of the present disclosure. At 802, method 800 can comprise initializing a bitline of an electronic circuit to a pullup voltage equal to a high voltage. At 804, method 800 can comprise loading respective sets of data into respective data storage portions of a set of comparative circuits connected to the bitline. In addition, at 806, method 800 can comprise connecting current most significant bits (MSBs) of respective sets of data to sensor logic portions of the set of comparative circuits. At 808, method 800 can comprise in a first clock cycle, following loading respective sets of data, eliminating all data sets whose MSBs are sensed to be equal to 1 in response to any open drain driver circuit associated with a comparative circuit pulling the bitline low. From 808, method 810 proceeds to a determination at 810, where method 800 determines whether any bits of the respective sets of data remain for analysis. If bits remain, method 800 can proceed to 812; otherwise method 800 can proceed to 816.

At 812, method 800 can comprise loading (e.g. by shift register circuits of the comparative circuits) next significant bits to the sensor logic portions of the set of comparative circuits. At 814 method 800 can comprise, in a subsequent clock cycle, eliminating all data sets whose next significant bit is sensed to be equal to 1 in response to any remaining comparative circuits pulling the bitline low. From 814, method 800 can proceed to the determination at reference number 810.

At 816, method 800 can comprise identifying a non-eliminated data set(s) of the respective sets of data. At 818, method 800 can comprise establishing the non-eliminated data set(s) as a minimum value data set.

Figure 9:
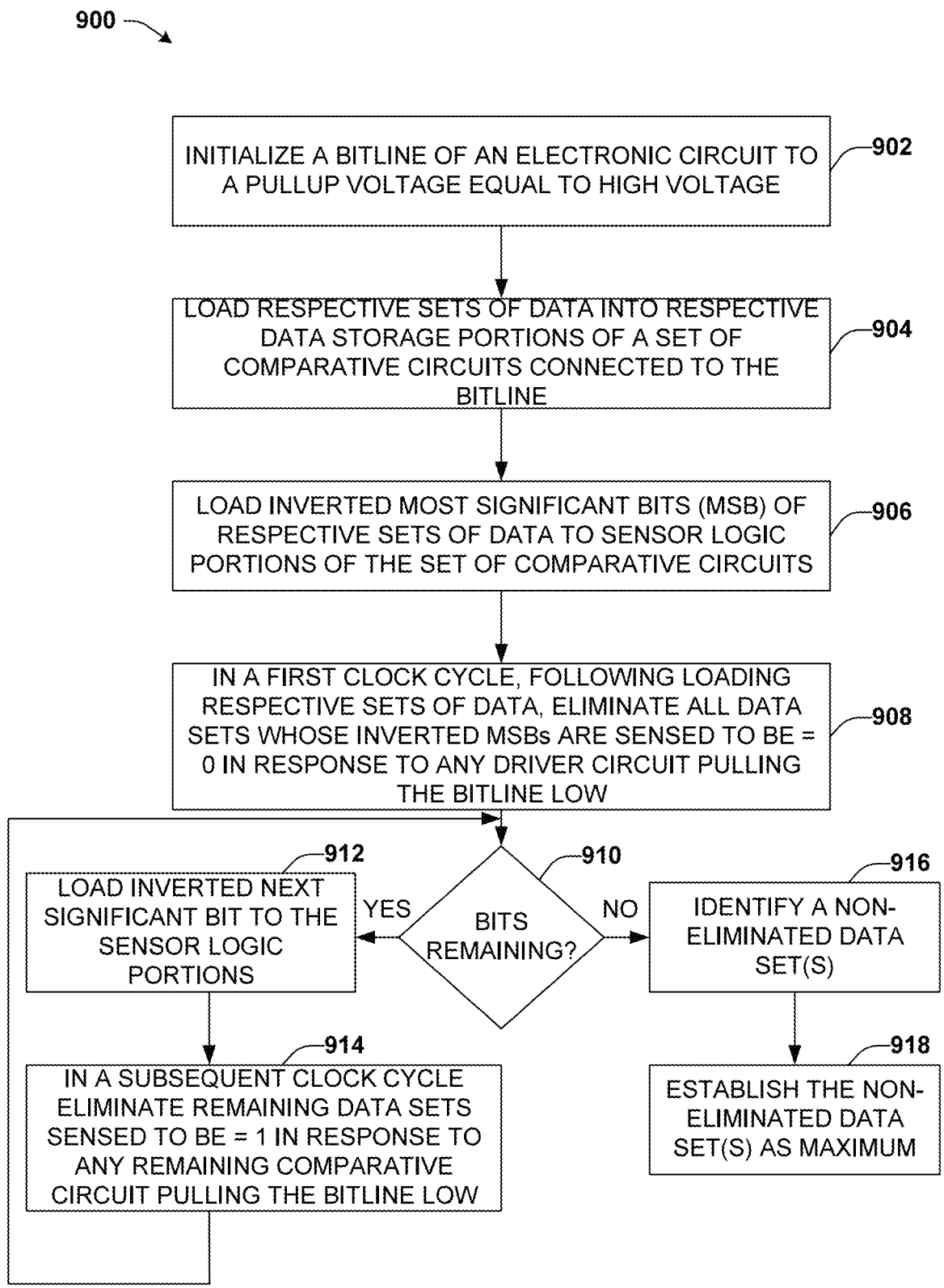
FIG. 9 illustrates a flowchart of an example method for identifying maximum values of disparate sets of data utilizing pulldown circuits integral with a memory device.

Referring now to FIG. 9, a flowchart of an example method 900 for implementing a comparative analysis operation according to alternative or additional embodiments of the present disclosure is provided. At 902, method 900 can comprise initializing a bitline of an electronic circuit to a pullup voltage equal to a high voltage. At 904, method 900 can comprise loading respective sets of data into respective data storage portions of a set of comparative circuits connected to the bitline, and at 906, method 900 can comprise connecting inverted most significant bits (MSBs) of respective sets of data to sensor logic portions of the set of comparative circuits. At 908, method 900 can comprise, in a first clock cycle following loading respective sets of data, eliminating all data sets whose inverted MSBs are sensed to be equal to 1 in response to any open drain driver of a comparative circuit pulling the bitline low.

At 910, method 900 can determine whether any bits of the respective sets of data remain for analysis. If bits remain, method 900 can proceed to 912. If no bits remain, method 900 proceeds to 916.

At 912, method 900 can comprise loading (e.g. by shift register circuits of the comparative circuits) inverted next significant bits to the sensor logic portions of the set of comparative circuits. At 914, method 900 can comprise in a subsequent clock cycle, eliminating remaining data sets sensed to be equal to 0 in response to any remaining comparative circuit pulling the bitline low. From 914, method 900 can proceed to reference number 910.

At 916, method 900 can comprise identifying a non-eliminated data set(s) of the respective sets of data. At 918, method 900 can comprise establishing the non-eliminated data set(s) as a maximum value data set.

Figure 10:
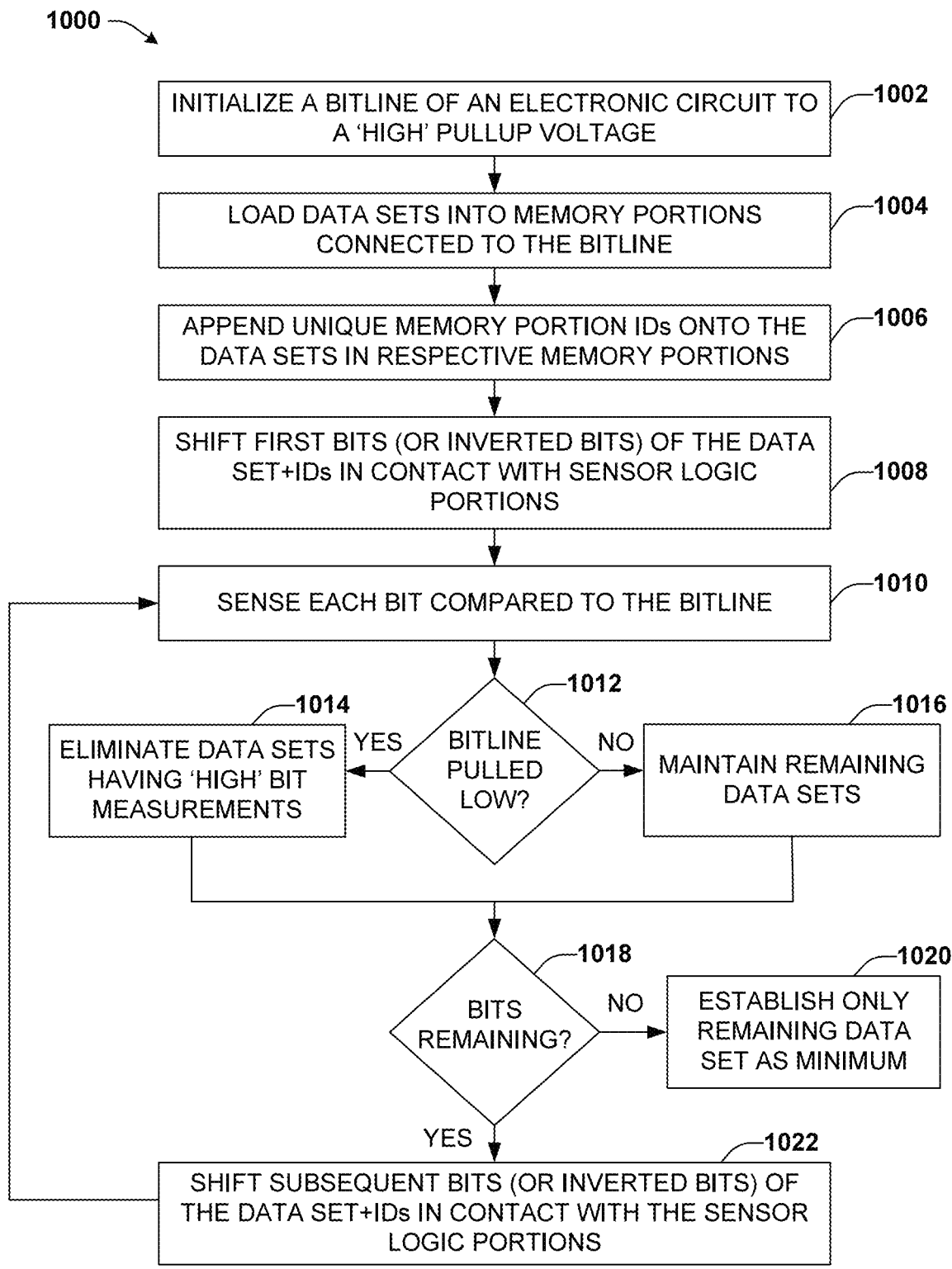
FIG. 10 depicts a flowchart of a sample method for comparing input data to stored data sets at a memory device, in an embodiment.

FIG. 10 depicts a flowchart of an example method 1000 according to still further embodiments of the present disclosure. At 1002, method 1000 can comprise initializing a bitline of an electronic circuit to a high pullup voltage. At 1004, method 1000 can comprise loading data sets into memory portions of comparative circuits connected to the bitline. At 1006 method 1000 can comprise appending unique memory portion identifiers onto the data sets in respective memory portions of the comparative circuits. Moreover, at 1008, method 1000 can comprise shifting first bits (or inverted bits) of the data set+identifiers in contact with sensor logic portions of the comparative circuits. In addition to the foregoing, method 1000 can comprise sensing each bit compared to the bitline. At 1012, method 1000 can comprise determining whether the bitline is pulled low. If the bitline is pulled low, method 1000 can proceed to 1014. If the bitline is not pulled low, method 1000 can proceed to 1016.

At 1014, method 1000 can comprise eliminating data sets having high bit measurements. From 1014, method 1000 can proceed to reference number 1018. At 1016, method 1000 can comprise maintaining remaining (non-eliminated) data sets. At 1018, a determination is made as to whether any bits of the data sets+identifiers remain for comparative analysis. If no bits remain, method 1000 can proceed to 1020 and can comprise establishing only a remaining data set as a minimum data set. At 1022, method 1000 can comprise shifting subsequent data bits (or inverted bits) of remaining data sets+identifier bits in contact with the sensor logic portions. From 1022, method 1000 can return to reference number 1010.

Figure 11:
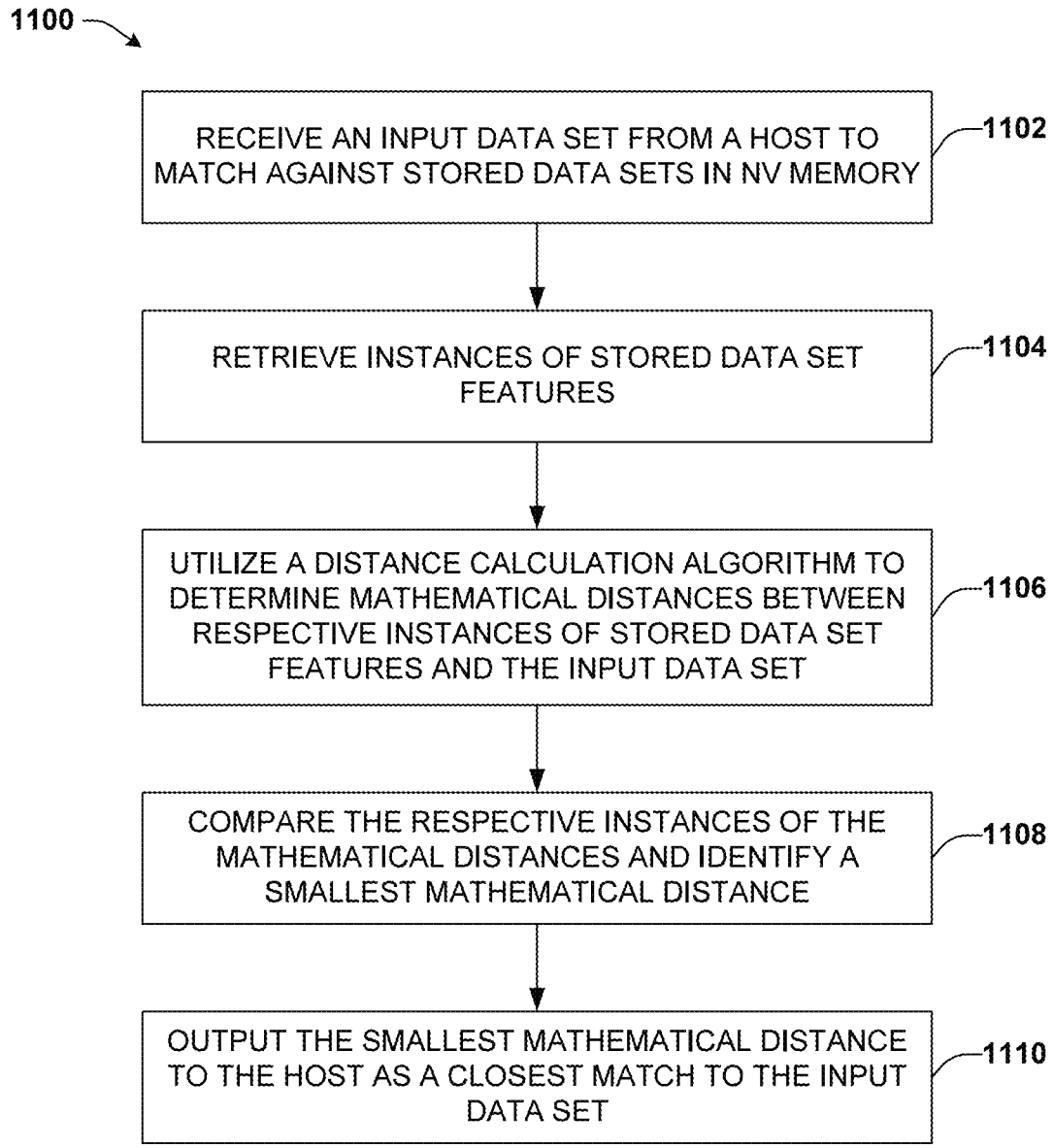
FIG. 11 illustrates a flowchart of an example method for matching input data among stored data sets and returning a closest match to the input data, in an embodiment.

Referring now to FIG. 11, a method 1100 is illustrated for implementing one or more alternative or additional embodiments of the present disclosure. At 1102, method 1100 can comprise receiving an input data set from a host to match against stored data sets in non-volatile memory. At 1104, method 1100 can comprise retrieving instances of stored data set features from the non-volatile memory and, at 1106, method 1100 can comprise utilizing a distance calculation algorithm to determine mathematical distances between respective instances of stored data set features and the input data set. At 1108, method 1100 can comprise comparing the respective instances of the mathematical distances and identify a smallest mathematical distance. At 1110, method 1100 can comprise outputting the smallest mathematical distance to the host as a closest match to the input data set.

Figure 12:
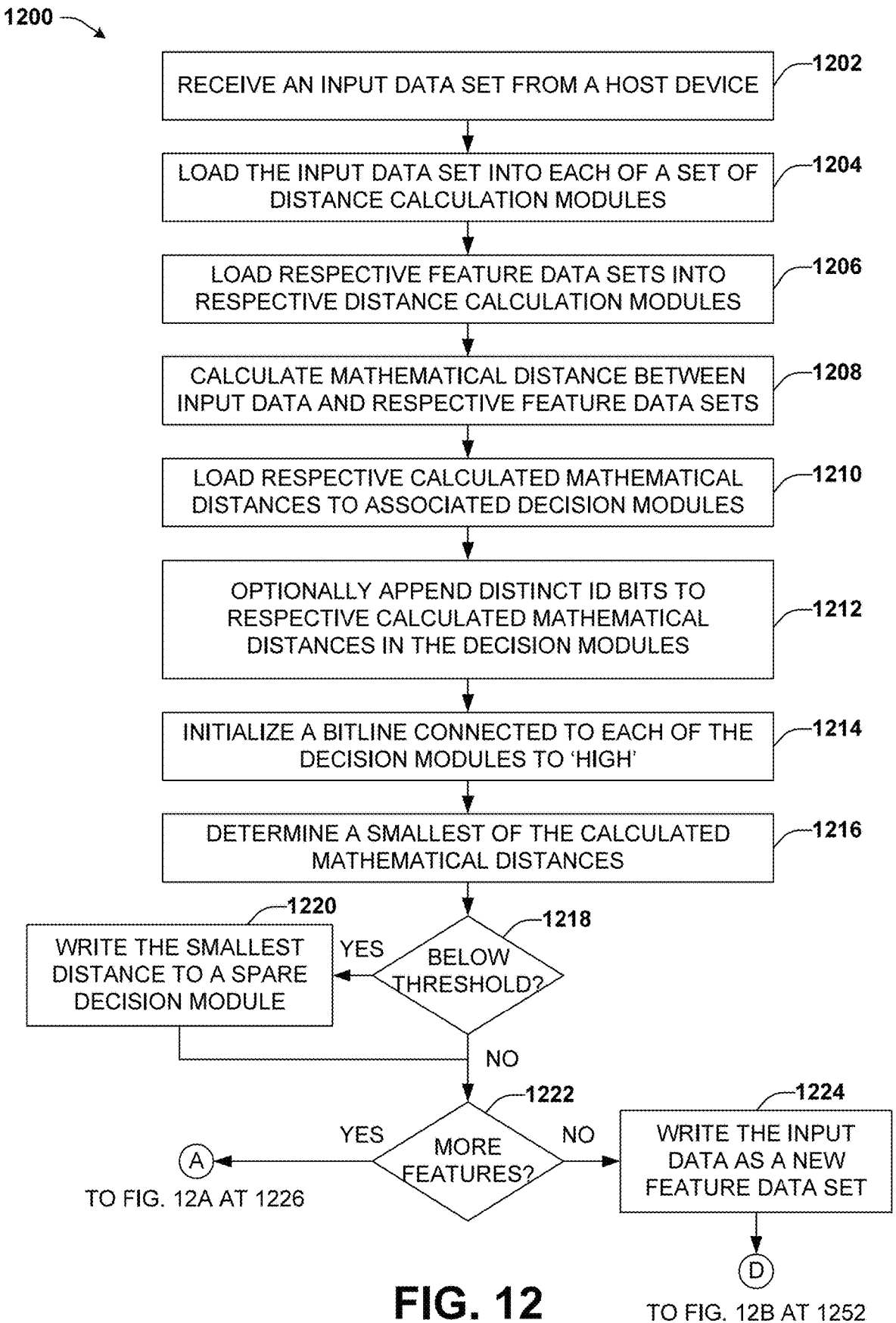
FIGS. 12, 12A and 12B illustrate a flowchart of a sample method for identifying stored data matching input data in conjunction with machine learning, in further embodiments.
Figure 12A:
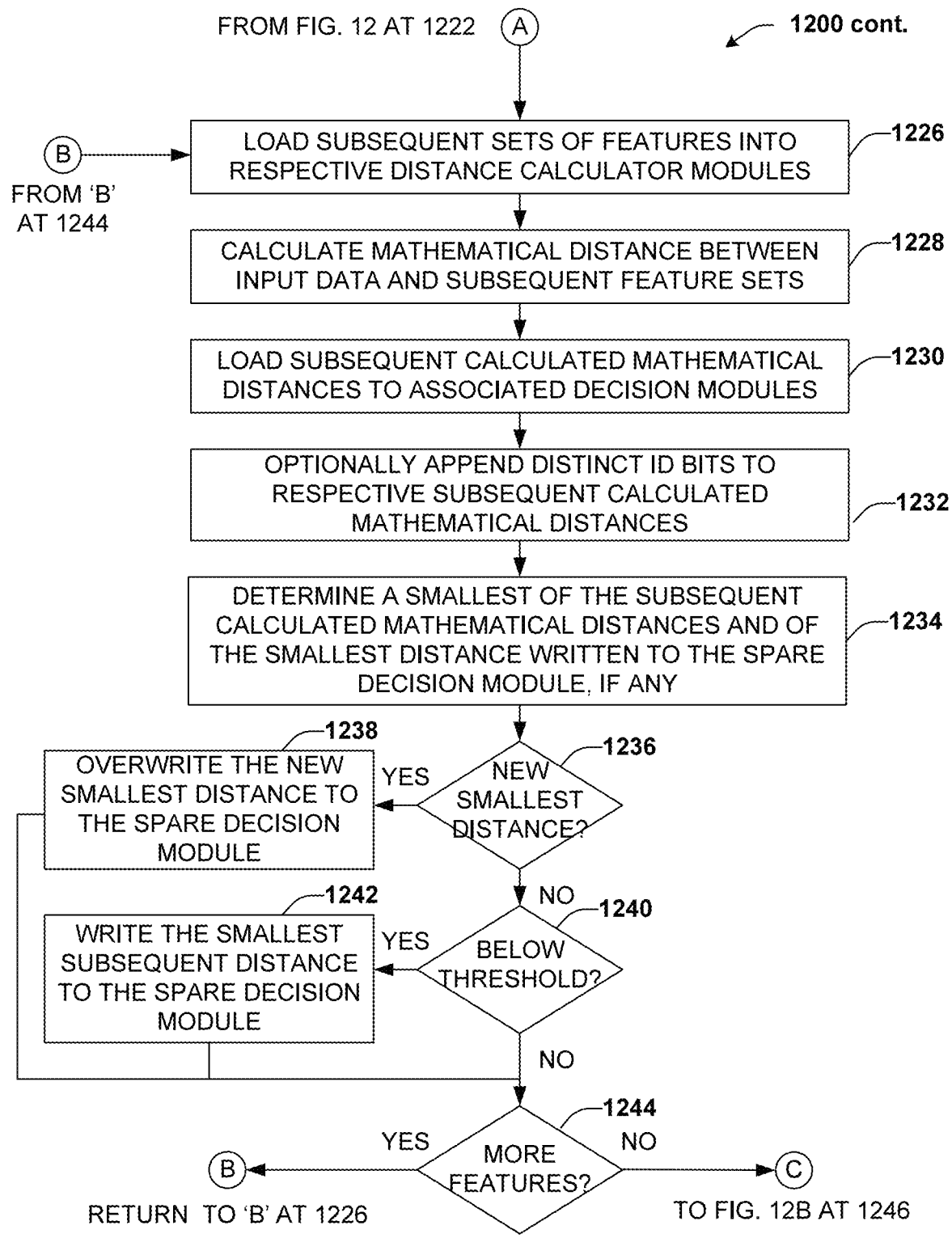
Figure 12B:
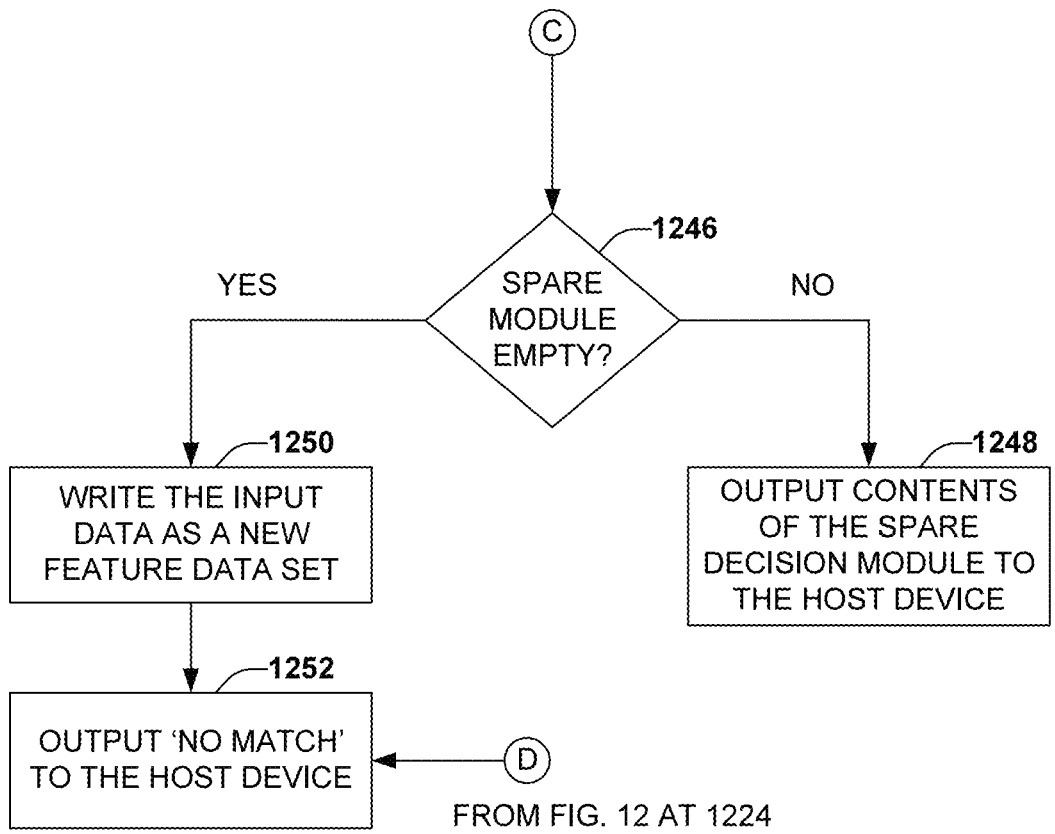

Referring now to FIGS. 12, 12A and 12B, a method 1200 is illustrated for implementing still other embodiments of the present disclosure. At 1202, method 1200 can comprise receiving an input data set from a host device, and at 1204, method 1200 can comprise loading the input data set into each of a set of distance calculation modules of a memory device. At 1206, method 1200 can comprise loading respective feature data sets into respective distance calculation modules of the memory device.

At 1208, method 1200 can comprise calculating mathematical distances between the input data and the respective feature data sets. At 1210, method 1200 can comprise loading respective calculated mathematical distances to associated decision modules of the memory device and at 1212, optionally appending distinct identifier bits to respective calculated mathematical distances in the decision modules.

At 1214, method 1200 can comprise initializing a bitline connected to each of the decision modules to high value. At 1216, method 1200 can comprise determining a smallest of the calculated mathematical distances. At 1218, method 1200 can comprise determining whether the smallest of the calculated mathematical distances is below a threshold. If yes method 1200 proceeds to 1220 and writes the smallest distance to a spare decision module of the memory device. Otherwise, method 1200 proceeds directly to 1222, and another determination is made as to whether more stored feature remain in the memory device. If no features remain, method 1200 can proceed to 1224 and write the input data as a new feature data set to the memory device. From 1224, method 1200 can proceed to FIG. 12B at 1252

In response to determining more stored features remain in the memory device, method 1200 can proceed to FIG. 12A at 1226. At 1226, method 1200 can comprise loading subsequent sets of features into respective distance calculator modules of the memory device. At 1228, method 1200 can comprise calculating mathematical distances between the input data and the subsequent feature sets. At 1230, method 1200 can comprise loading subsequent calculated mathematical distances to associated decision modules and, at 1232, method 1200 can comprise optionally appending distinct identifier bits to respective subsequent calculated mathematical distances. At 1234, method 1200 can comprise determining a smallest of the subsequent mathematical distances and of the smallest distance written to the spare decision module (if any). At 1236, a decision is made as to whether a new smallest distance determination is identified. If so, method 1200 can proceed to 1238 and can comprise overwriting the new smallest distance to the spare decision module. If a new smallest distance determination is not identified, method 1200 can proceed to 1240 and determine whether the smallest of the subsequent calculated mathematical distances and the smallest distance written to the spare decision module is below a threshold. If the below the threshold, method 1200 proceeds to 1242 and writes the smallest subsequent distance to the spare decision module. Otherwise method 1200 proceeds to 1244 and determines whether more stored features remain. If more stored features remain, method 1200 can return to 1226 of FIG. 12, supra. Otherwise, method 1200 can proceed to 1246 on FIG. 12B.

Referring to FIG. 12B, method 1200 continues at 1246 where a determination is made as to whether the spare decision module is empty. If the spare decision module is empty, method 1200 can proceed to 1250 and can comprise writing the new input data as a new feature data set to the memory device. At 1252, method 1200 can comprise outputting a "no match" result to the host device. If the spare module is not empty, method 1200 proceeds from 1246 to 1248 and outputs contents of the spare decision module to the host device as a match result for the input data.

Example Operating Environments

Figure 13:
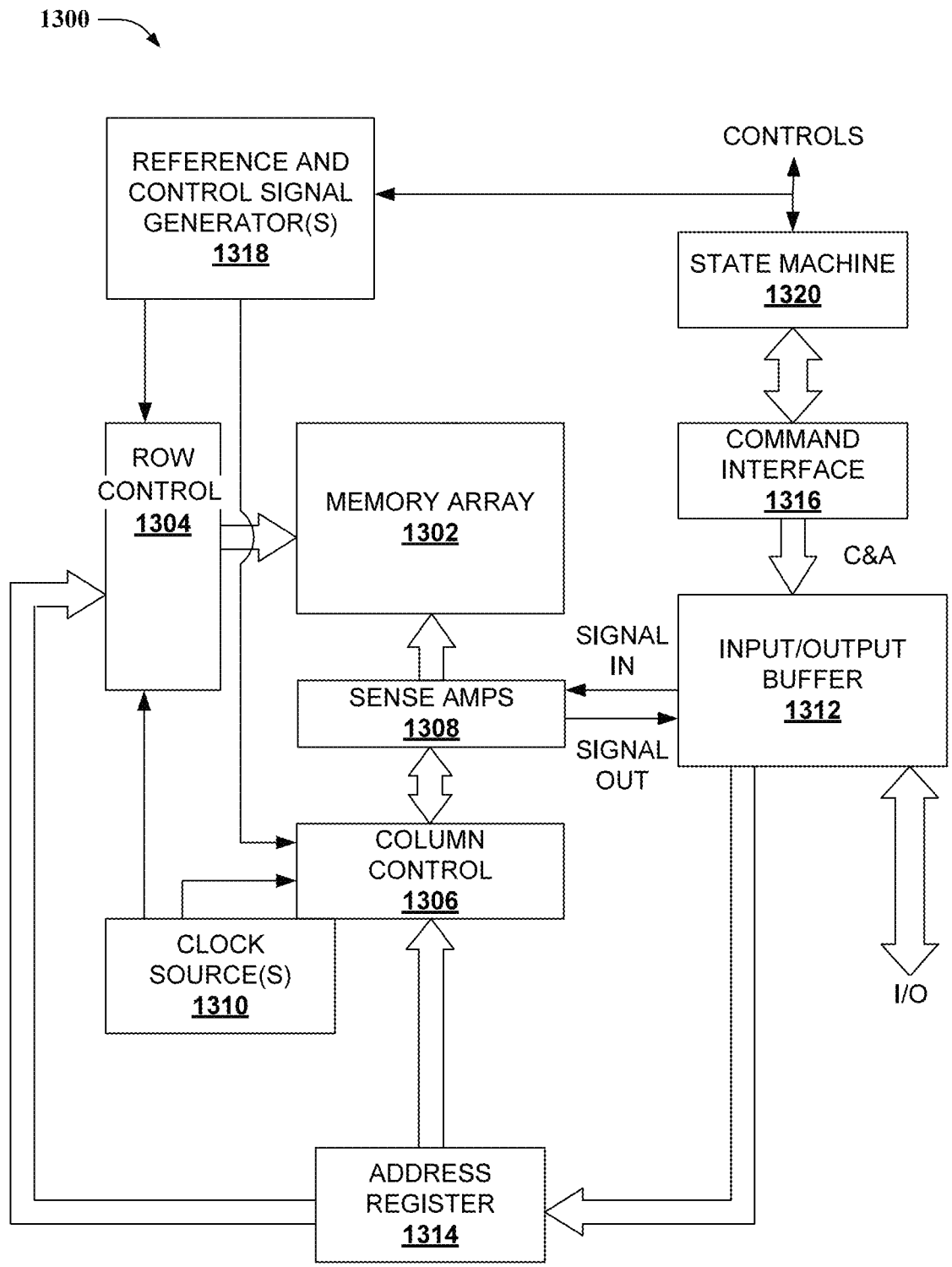
FIG. 13 illustrates a block diagram of an example control and operating environment for a memory device to facilitate one or more disclosed embodiments.

In order to provide a context for the various aspects of the disclosed subject matter, FIG. 13, as well as the following discussion, is intended to provide a brief, general description of a suitable environment in which various aspects of the disclosed subject matter can be implemented or processed. While the subject matter has been described above in the general context of semiconductor architectures and process methodologies for operating arrays of two-terminal memory devices, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects can also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 13 illustrates a block diagram of an example operating and control environment 1300 for a memory array 1302 of a multi-block memory cell array according to aspects of the subject disclosure. In at least one aspect of the subject disclosure, memory array 1302 can comprise memory selected from a variety of memory cell technologies. In at least one embodiment, memory array 1302 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In yet another embodiment, memory array 1302 can be configured to operate according to bulk program or erase operations as provided herein.

A column controller 1306 and sense amps 1308 can be formed adjacent to memory array 1302. Moreover, column controller 1306 can be configured to activate (or identify for activation) a subset of bitlines of memory array 1302. Column controller 1306 can utilize a control signal provided by a reference and control signal generator(s) 1318 to activate, as well as operate upon, respective ones of the subset of bitlines, applying suitable program, erase or read voltages to those bitlines. Non-activated bitlines can be kept at an inhibit voltage (also applied by reference and control signal generator(s) 1318), to mitigate or avoid bit-disturb effects on these non-activated bitlines.

In addition, operating and control environment 1300 can comprise a row controller 1304. Row controller 1304 can be formed adjacent to and electrically connected with word lines (and sourcelines, in some embodiments) of memory array 1302. Further, utilizing control signals of reference and control signal generator(s) 1318, row controller 1304 can select particular rows of memory cells with a suitable selection voltage. Moreover, row controller 1304 can facilitate program, erase or read operations by applying suitable voltages at selected word lines (and sourcelines). Similar to column controller 1306, row controller 1304 can apply an inhibit voltage to non-activated wordlines (sourcelines) to mitigate or avoid bit-disturb effects on the non-activated wordlines (sourcelines).

Sense amps 1308 can read data from, or write data to the activated memory cells of memory array 1302, which are selected by column control 1306 and row control 1304. Data read out from memory array 1302 can be provided to an input and input/output buffer 1312. Likewise, data to be written to memory array 1302 can be received from the input and input/output buffer 1312 and written to the activated memory cells of memory array 1302.

A clock source(s) 1310 can provide respective clock pulses to facilitate timing for read, write, and program operations of row controller 1304 and column controller 1306. Clock source(s) 1310 can further facilitate selection of wordlines or bitlines in response to external or internal commands received by operating and control environment 1300. Input and input/output buffer 1312 can comprise a command and address input, as well as a bidirectional data input and output. Instructions are provided over the command and address input, and the data to be written to memory array 1302 as well as data read from memory array 1302 is conveyed on the bidirectional data input and output, facilitating connection to an external host apparatus, such as a computer or other processing device (not depicted, but see e.g., computer 1402 of FIG. 14, infra).

Input and input/output buffer 1312 can be configured to receive write data, receive an erase instruction, receive a status or maintenance instruction, output readout data, output status information, and receive address data and command data, as well as address data for respective instructions. Address data can be transferred to row controller 1304 and column controller 1306 by an address register 1310. In addition, input data is transmitted to memory array 1302 via signal input lines between sense amps 1308 and input and input/output buffer 1312, and output data is received from memory array 1302 via signal output lines from sense amps 1308 to input and input/output buffer 1312. Input data can be received from the host apparatus, and output data can be delivered to the host apparatus via the I/O bus.

Commands received from the host apparatus can be provided to a command interface 1316. Command interface 1316 can be configured to receive external control signals from the host apparatus, and determine whether data input to the input and input/output buffer 1312 is write data, a command, or an address. Input commands can be transferred to a state machine 1320.

State machine 1320 can be configured to manage programming and reprogramming of memory array 1302 (as well as other memory banks of the multi-bank memory array). Instructions provided to state machine 1320 are implemented according to control logic configurations, enabling state machine 1320 to manage read, write, erase, data input, data output, and other functionality associated with memory array 1302. In some aspects, state machine 1320 can send and receive acknowledgments and negative acknowledgments regarding successful receipt or execution of various commands. In further embodiments, state machine 1320 can decode and implement status-related commands, decode and implement configuration commands, and so on.

To implement read, write, erase, input, output, etc., functionality, state machine 1320 can control clock source(s) 1308 or reference and control signal generator(s) 1318. Control of clock source(s) 1308 can cause output pulses configured to facilitate row controller 1304 and column controller 1306 implementing the particular functionality. Output pulses can be transferred to selected bitlines by column controller 1306, for instance, or wordlines by row controller 1304, for instance.

Figure 14:
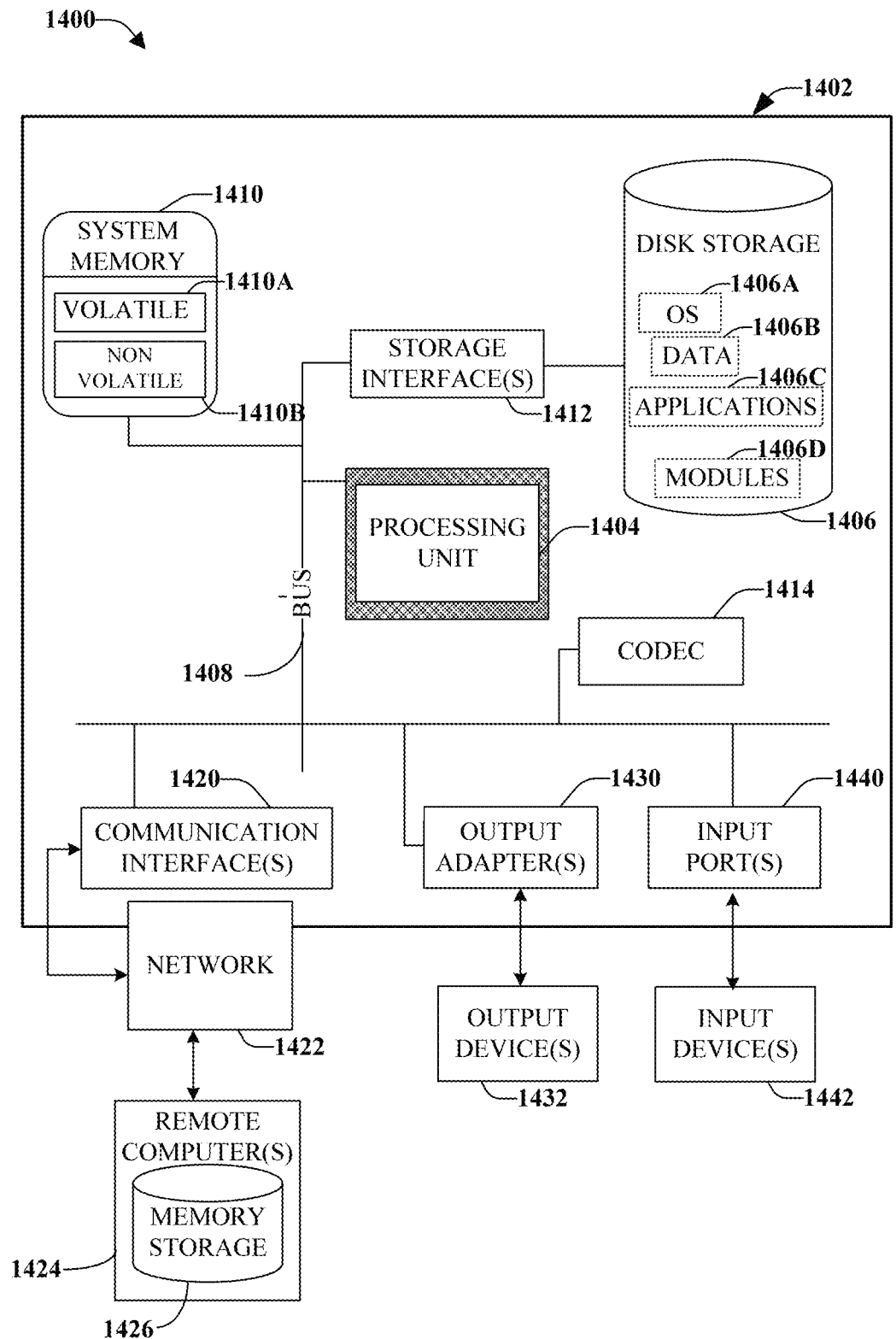
FIG. 14 depicts a block diagram of an example computing environment in accordance with certain embodiments of the subject disclosure.

With reference to FIG. 14, a suitable environment 1400 for implementing various aspects of the claimed subject matter includes a computer 1402. The computer 1402 includes a processing unit 1404, a system memory 1410, a codec 1414, and a system bus 1408. The system bus 1408 couples system components including, but not limited to, the system memory 1410 to the processing unit 1404. The processing unit 1404 can be any of various available processors. Dual microprocessors and other multiprocessor architectures also can be employed as the processing unit 1404.

The system bus 1408 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1410 includes volatile memory 1410A and non-volatile memory 1410B. The basic input/output system (BIOS), containing the basic routines to transfer information between elements within the computer 1402, such as during start-up, is stored in non-volatile memory 1410B. In addition, according to present innovations, codec 1414 may include at least one of an encoder or decoder, wherein the at least one of an encoder or decoder may consist of hardware, software, or a combination of hardware and software. Although, codec 1414 is depicted as a separate component, codec 1414 may be contained within non-volatile memory 1410B. By way of illustration, and not limitation, non-volatile memory 1410B can include read only memory (ROM), programmable ROM (PROM), electrically programmable ROM (EPROM), electrically erasable programmable ROM (EEPROM), or flash memory, two-terminal memory, and so on. Volatile memory 1410A includes random access memory (RAM), which acts as external cache memory. According to present aspects, the volatile memory may store the write operation retry logic (not shown in FIG. 14) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1402 may also include removable/non-removable, volatile/non-volatile computer storage medium. FIG. 14 illustrates, for example, disk storage 1406. Disk storage 1406 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1406 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1406 to the system bus 1408, a removable or non-removable interface is typically used, such as storage interface 1412. It is appreciated that storage devices 1406 can store information related to a user. Such information might be stored at or provided to a server or to an application running on a user device. In one embodiment, the user can be notified (e.g., by way of output device(s) 1432) of the types of information that are stored to disk storage 1406 or transmitted to the server or application. The user can be provided the opportunity to opt-in or opt-out of having such information collected and/or shared with the server or application (e.g., by way of input from input device(s) 1442).

It is to be appreciated that FIG. 14 describes software that acts as an intermediary between users and the basic computer resources described in the suitable operating environment 1400. Such software includes an operating system 1406A. Operating system 1406A, which can be stored on disk storage 1406, acts to control and allocate resources of the computer system 1402. Applications 1406C take advantage of the management of resources by operating system 1406A through program modules 1406D, and program data 1406D, such as the boot/shutdown transaction table and the like, stored either in system memory 1410 or on disk storage 1406. It is to be appreciated that the claimed subject matter can be implemented with various operating systems or combinations of operating systems.

A user enters commands or information into the computer 1402 through input device(s) 1442. Input devices 1442 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1404 through the system bus 1408 via input port(s) 1440. Input port(s) 1440 include, for example, a serial port, a parallel port, a game port, and a universal serial bus (USB). Output device(s) 1432 use some of the same type of ports as input device(s) 1442. Thus, for example, a USB port may be used to provide input to computer 1402 and to output information from computer 1402 to an output device 1432. Output adapter 1430 is provided to illustrate that there are some output devices 1432 like monitors, speakers, and printers, among other output devices 1432, which require special adapters. The output adapters 1430 include, by way of illustration and not limitation, video and sound cards that provide a means of connection between the output device 1432 and the system bus 1408. It should be noted that other devices and/or systems of devices provide both input and output capabilities such as remote computer(s) 1438.

Computer 1402 can operate in a networked environment using logical connections to one or more remote computers, such as remote computer(s) 1424. The remote computer(s) 1424 can be a personal computer, a server, a router, a network PC, a workstation, a microprocessor based appliance, a peer device, a smart phone, a tablet, or other network node, and typically includes many of the elements described relative to computer 1402. For purposes of brevity, only a memory storage device 1426 is illustrated with remote computer(s) 1424. Remote computer(s) 1424 is logically connected to computer 1402 through a network 1422 and then connected via communication interface(s) 1420. Network 1422 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1420 refers to the hardware/software employed to connect the network 1422 to the bus 1408. While communication interface(s) 1420 is shown for illustrative clarity inside computer 1402, it can also be external to computer 1402. The hardware/software necessary for connection to the network 1422 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReRAM devices (e.g. 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A memory device, comprising:
   a non-volatile memory comprising an array of resistive switching memory devices formed overlying and monolithically integrated with a substrate of a semiconductor chip;

read sensors for reading data values stored at the array of resistive switching memory devices; and a set of pattern recognition (PR) engines coupled to respective groups of the read sensors and coupled to a host interface configured to communicatively connect the memory device to a host device, wherein:

each of the set of PR engines is coupled to a common bitline of the memory device;

a PR engine of the set of PR engines receives data read by a group of read sensors of the respective groups of read sensors from a portion of the array of resistive switching memory devices that is allocated to the PR engine, the PR engine is configured to perform a comparative analysis function on the data and with respect to other sets of data written by other groups of the read sensors to other PR engines of the set of PR engines, and output a result of the comparative analysis function on the host interface to the host device.

2. The memory device of claim 1, wherein the read sensors and the set of pattern recognition engines are formed monolithically integrated with the substrate of the semiconductor chip and with the non-volatile memory.

3. The memory device of claim 2, wherein the read sensors and the set of pattern recognition engines are formed at least in part within the substrate of the semiconductor chip.

4. The memory device of claim 1, wherein the PR engine comprises:

a comparative circuit, which comprises:

a data storage portion for writing the data read by the group of read sensors to the PR engine, and having a number of bits including a measurement bit;

a driver circuit configured to pull a voltage value of the common bitline low in response to a value of the measurement satisfying a condition; and a sense logic portion coupled to the bitline and to the measurement bit of the data storage portion;

a shift register for shifting respective bits of the data written to the data storage portion onto the measurement bit of the data storage portion; and a switch controlled by the sense logic portion for selectively connecting the data storage portion to, or disconnecting the data storage portion from, the bitline.

5. The memory device of claim 4, wherein:

the shift register sequentially shifts bits of the data onto the measurement bit of the data storage portion;

the sense logic portion senses a value of the bitline and a value of the measurement bit, and one of:

causes the switch to disconnect the data storage portion and the sense logic portion from the bitline in response to the bitline being low, or zero, and in response to the value of the measurement bit being high; or causes the switch to maintain connection of the data storage portion and the sense logic portion to the bitline in response to the bitline being high, or in response to the value of the measurement bit being low.

6. The memory device of claim 1, wherein the PR engines are configured to complete the comparative analysis function in a number of clock cycles equal to a number of bits of the data.

7. The memory device of claim 1, wherein the PR engines are configured to complete the comparative analysis function in a number of clock cycles equal to a number of bits of the data plus a number of identifier bits, wherein the number of identifier bits uniquely distinguish each PR engine of the set of PR engines.

8. The memory device of claim 1, wherein each PR engine of the set of PR engines comprises an algorithm module for executing an algorithm on input data received from by the host device over the host interface and on the data read by the group of read sensors, and producing a calculation result, wherein the PR engine performs the comparative analysis function on the calculation result with respect to other calculation results generated by algorithm modules of each of the PR engines.

9. The memory device of claim 8, wherein the input data is image data, the data read by the group of read sensors is stored image data, the calculation result determines a mathematical distance between the image data and the stored image data, and the comparative analysis function determines a best match stored image data among the PR engines.

10. The memory device of claim 9, wherein the algorithm is selected from a group consisting essentially of: a Manhattan distance algorithm, a Sup-Norm algorithm and a Euclidean distance algorithm.

* * * * *